(12) United States Patent
Nishizawa et al.

(10) Patent No.: US 9,347,776 B2
(45) Date of Patent: May 24, 2016

(54) VIBRATING ELEMENT AND MANUFACTURING METHOD FOR THE SAME, GYRO SENSOR, ELECTRONIC APPARATUS AND MOVING OBJECT

(71) Applicant: Seiko Epson Corporation, Tokyo (JP)

(72) Inventors: Ryuta Nishizawa, Matsumoto (JP); Keiji Nakagawa, Kamiina (JP); Takayuki Kikuchi, Okaya (JP)

(73) Assignee: Seiko Epson Corporation (JP)

( * ) Notice: Subject to any disclaimer, the term of this patent is extended or adjusted under 35 U.S.C. 154(b) by 767 days.

(21) Appl. No.: 13/850,599

(22) Filed: Mar. 26, 2013

(65) Prior Publication Data

US 2013/0305824 A1 Nov. 21, 2013

(30) Foreign Application Priority Data

Mar. 28, 2012 (JP) ................................. 2012-074795

(51) Int. Cl.
| | | |
|---|---|---|
| *G01C 19/00* | (2013.01) | |
| *G01C 19/5607* | (2012.01) | |
| *H01L 41/047* | (2006.01) | |
| *H01L 41/107* | (2006.01) | |
| *H01L 41/25* | (2013.01) | |

(52) U.S. Cl.
CPC ........ *G01C 19/5607* (2013.01); *H01L 41/0472* (2013.01); *H01L 41/107* (2013.01); *H01L 41/25* (2013.01); *Y10T 29/42* (2015.01)

(58) Field of Classification Search
CPC ............ G01C 19/5607; H01L 41/0472; H01L 41/107; H01L 41/25
See application file for complete search history.

(56) References Cited

U.S. PATENT DOCUMENTS

| | | | | | |
|---|---|---|---|---|---|
| 4,930,351 | A | * | 6/1990 | Macy ................. | G01C 19/5607 73/504.04 |
| 5,251,483 | A | * | 10/1993 | Soderkvist ......... | G01C 19/5607 73/504.16 |
| 5,343,749 | A | * | 9/1994 | Macy ................. | G01C 19/5607 73/504.16 |
| 5,522,249 | A | * | 6/1996 | Macy ................. | G01C 19/5607 310/370 |
| 5,585,562 | A | * | 12/1996 | Kurata ............... | G01C 19/5607 73/504.16 |
| 5,629,483 | A | * | 5/1997 | Nakamura .............. | G01P 15/09 310/321 |
| 5,635,642 | A | * | 6/1997 | Nonomura ......... | G01C 19/5607 73/504.16 |
| 5,945,599 | A | * | 8/1999 | Fujiyoshi ........... | G01C 19/5719 73/504.12 |
| 6,101,878 | A | | 8/2000 | Watarai | |
| 6,119,519 | A | * | 9/2000 | Konno ............... | G01C 19/5607 73/504.16 |

(Continued)

FOREIGN PATENT DOCUMENTS

| | | |
|---|---|---|
| DE | 696 14 340 T2 | 5/2002 |
| JP | 07-280572 | 10/1995 |

(Continued)

*Primary Examiner* — Harshad R Patel
*Assistant Examiner* — Samir M Shah
(74) *Attorney, Agent, or Firm* — Harness, Dickey & Pierce, P.L.C.

(57) ABSTRACT

A vibrating element includes a vibrating arm for detection. An electrode is provided on the vibrating arm for detection. A wiring line is connected to the electrode. The wiring line is arranged on a piezoelectric body of a base portion. At least a part of the wiring line is an electrode for adjustment. The electrode for adjustment generates an electrical signal with an opposite phase to an output signal of leak vibration of the vibrating arm for detection.

3 Claims, 19 Drawing Sheets

(56) References Cited

U.S. PATENT DOCUMENTS

| | | | |
|---|---|---|---|
| 6,125,701 A * | 10/2000 | Sugitani | G01C 19/5607 73/504.16 |
| 6,134,962 A * | 10/2000 | Sugitani | G01C 19/5607 310/329 |
| 6,223,597 B1 | 5/2001 | Watarai | |
| 6,253,613 B1 * | 7/2001 | Yachi | G01C 19/5607 73/504.16 |
| 6,327,908 B1 * | 12/2001 | Yachi | G01C 19/5607 73/504.16 |
| 6,666,091 B2 * | 12/2003 | Hatanaka | G01C 19/5607 73/504.16 |
| 6,806,797 B2 | 10/2004 | Kikushima | |
| 6,889,550 B2 | 5/2005 | Beitia | |
| 7,207,221 B2 * | 4/2007 | Kawauchi | G01C 19/5607 73/504.12 |
| 7,365,478 B2 | 4/2008 | Kawashima | |
| 7,975,545 B2 * | 7/2011 | Noguchi | G01C 19/5642 73/504.12 |
| 9,130,147 B2 * | 9/2015 | Nishizawa | H01L 41/0475 |
| 2001/0010169 A1 | 8/2001 | Watarai | |
| 2002/0033653 A1 * | 3/2002 | Janiaud | G01C 19/5607 310/367 |
| 2006/0053883 A1 | 3/2006 | Hayashi et al. | |
| 2008/0105052 A1 * | 5/2008 | Takahashi | G01C 19/5607 73/504.16 |
| 2010/0064806 A1 * | 3/2010 | Inaguma | G01C 19/5607 73/504.12 |
| 2010/0116052 A1 * | 5/2010 | Yanagisawa | G01C 19/5607 73/504.16 |
| 2011/0227452 A1 * | 9/2011 | Yamada | H03H 9/02062 310/323.01 |
| 2012/0103093 A1 * | 5/2012 | Yanagisawa | H03F 1/26 73/504.12 |
| 2012/0126664 A1 * | 5/2012 | Ogura | G01C 19/5607 310/312 |
| 2013/0019681 A1 * | 1/2013 | Shimura | G01C 19/5607 73/504.16 |
| 2013/0205898 A1 * | 8/2013 | Nakagawa | G01C 19/5621 73/504.16 |
| 2013/0283910 A1 * | 10/2013 | Nishizawa | H01L 41/0475 73/504.12 |

FOREIGN PATENT DOCUMENTS

| | | |
|---|---|---|
| JP | 2518600 | 5/1996 |
| JP | 10-170274 | 6/1998 |
| JP | 10-325728 A | 12/1998 |
| JP | 11-063999 A | 3/1999 |
| JP | 3368723 | 11/2002 |
| JP | 2004-007428 | 1/2004 |
| JP | 2004-251663 | 9/2004 |
| JP | 3674013 | 5/2005 |
| JP | 3752737 | 12/2005 |
| JP | 4147784 | 7/2008 |
| JP | 2008-267983 | 11/2008 |
| JP | 2009-236552 A | 10/2009 |
| JP | 2011-075415 | 4/2011 |

* cited by examiner

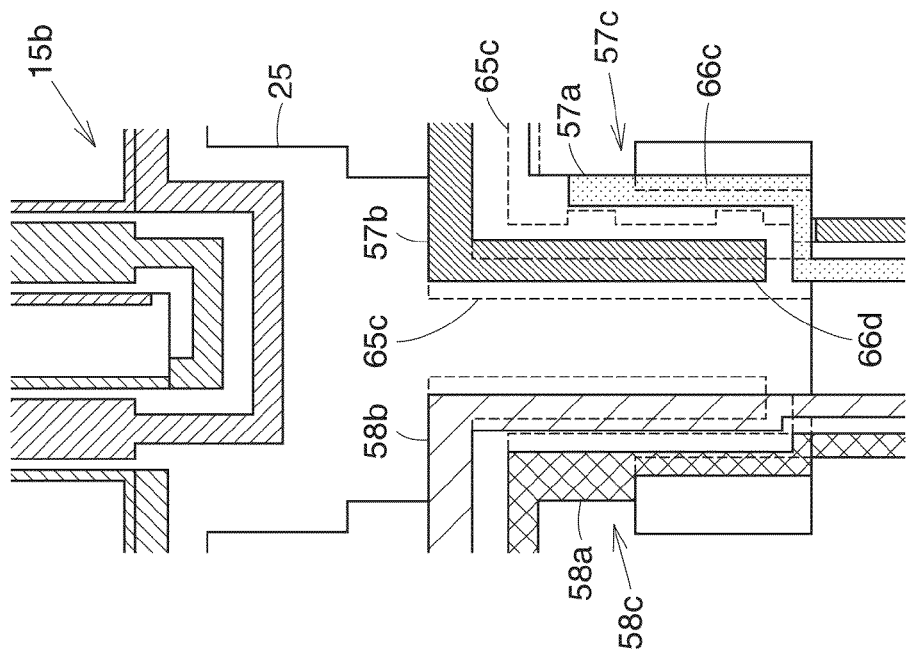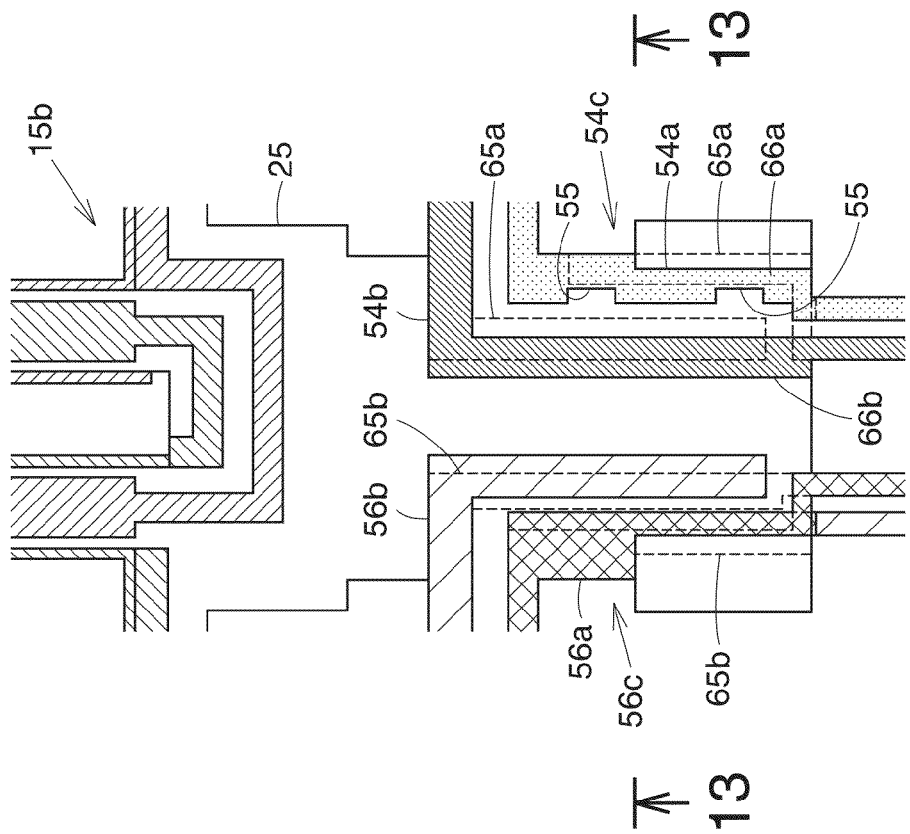

VIBRATING ELEMENT AND MANUFACTURING METHOD FOR THE SAME, GYRO SENSOR, ELECTRONIC APPARATUS AND MOVING OBJECT

BACKGROUND

1. Technical Field

The present invention relates to a vibrating element and a manufacturing method for the same, a gyro sensor utilizing the vibrating element, an electronic apparatus and moving object or the like having the vibrating element incorporated therein.

2. Related Art

For example, a vibrating element utilized in a gyro sensor is generally known. If angular velocity motion is applied to the vibrating element, a Coriolis force acts to change the direction of vibration of a vibrating arm for driving. A new force component is generated in a specific direction corresponding to the Coriolis force. This force component causes motion of a vibrating arm for detection. Thus, an output signal corresponding to the force component is outputted from the vibrating arm for detection.

The main body of the vibrating element can be sliced out of a material, for example, a piezoelectric material. In slicing the material, a mask is arranged on a face side and a back side of the material. When a misalignment occurs between the masks, the lateral sides of the vibrating arm for driving cannot stay orthogonal to the face side and the back side and become inclined. As a processing error thus occurs in the cross-sectional shape of the vibrating arm for driving, the vibrating arm for driving cannot vibrate within a prescribed imaginary plane and vibrates in an imaginary plane that is inclined from the prescribed imaginary plane. Thus, so-called slant vibration occurs. Such a phenomenon is called vibration leakage, and a leak vibration component is superimposed on the force component in an output signal from the vibrating arm for detection. Consequently, the S/N ratio of the output signal is deteriorated. That is, a signal to be noise is outputted from the vibrating element in the state where angular velocity motion is not inputted. In JP-A-2008-267983, detection electrodes are partly removed in order to eliminate the leak vibration component. However, such elimination of detection electrodes induces reduction in signal intensity. Therefore, the S/N ratio of the output signal cannot be improved as expected.

SUMMARY

An advantage of some aspects of the invention is to provide a vibrating element in which the S/N ratio of the output signal can be improved without lowering the intensity of the output signal.

(1) An aspect of the invention relates to a vibrating element including: a base portion including a piezoelectric body at least in a part thereof; a vibrating arm for driving and a vibrating arm for detection which extend from the base portion; a wiring line which is connected to an electrode provided on the vibrating arm for detection and is arranged in the piezoelectric body; and an adjustment electrode which is at least a part of the wiring line and generates an electrical signal with an opposite phase to an output signal of leak vibration from the vibrating arm for detection.

This vibrating element can be used to detect angular velocity. In detecting angular velocity, vibration is excited by the vibrating arm for driving. At this point, if angular velocity motion is applied to the vibrating element, a Coriolis force acts to change the direction of vibration of the vibrating arm for driving. A new force component is generated in a specific direction corresponding to the Coriolis force. This force component causes motion of the vibrating arm for detection. Thus, an output signal corresponding to the force component is outputted from the vibrating arm for detection.

If the shape of the vibrating arm for detection deviates from a designed shape, a leak vibration component is superimposed on the force component in the output signal of the vibrating arm for detection. At this point, the adjustment electrode generates an electrical signal with an opposite phase to the output signal of leak vibration of the vibrating arm for detection. The generated electrical signal is superimposed on the output signal of vibrating arm for detection. Consequently, the leak vibration component is canceled in the output signal of the vibrating arm for detection. The S/N ratio of the output signal is thus improved.

(2) At least a part of the adjustment electrode may be eliminated. When the adjustment electrode is thus eliminated, the area of the piezoelectric body which contacts the adjustment electrode is reduced. Therefore, the piezoelectric body contributing to the generation of the electrical signal with the opposite phase decreases. The amount of electric charge of the electrical signal with the opposite phase can thus be adjusted. Therefore, the leak vibration component can be canceled satisfactorily.

(3) The adjustment electrode may include a wiring line main body connected to the electrode provided on the vibrating arm for detection, and plural electrically conductive pieces which are arrayed in a longitudinal direction of the wiring line main body and are each connected to the wiring line main body via an electrically conductive thin line.

A current of the piezoelectric body is taken out from the electrically conductive pieces and the electrode. The current flows from the electrically conductive pieces to the wiring line main body. When the electrically conductive thin line is eliminated, the current circulating from the electrically conductive pieces to the wiring line main body is reduced. Consequently, the current contributing to the generation of the electrical signal with the opposite phase decreases. The amount of electric charge of the electrical signal with the opposite phase can thus be adjusted. The leak vibration component can be canceled satisfactorily. Since the amount of increase or decrease in the amount of electric charge depends on the size of the electrically conductive pieces, the amount of electric charge of the electrical signal with the opposite phase can be adjusted by simple work such as maintaining or eliminating the electrically conductive thin line.

(4) The adjustment electrode may include a first adjustment electrode arranged on a first plane of the base portion, and a second adjustment electrode formed on a second plane of the base portion that is in a face-and-back relationship with the first plane. The arrangement area for the adjustment electrode can be doubled. Therefore, the adjustment range for the electrical signal can be expanded. Alternatively, the amount of electric charge of the electrical signal can be adjusted finely.

(5) An arrangement area for the first adjustment electrode and an arrangement area for the second adjustment electrode may be partly shifted from each other. With such a shift between the electrodes, the elimination does not affect the wiring line on the back side even if the base portion is made of a transparent material. The wiring line on the back side can be maintained as designed.

(6) An electrical signal outputted from the first adjustment electrode and an electrical signal outputted from the second adjustment electrode may be in phase with each other. When a distortion occurs in the base portion at the time of vibration of the vibrating arm for driving, electrical signals of the same phase can be taken out from the first adjustment electrode and the second adjustment electrode. Therefore, the magnitude of the electrical signal is doubled.

(7) An electrical signal outputted from the first adjustment electrode and an electrical signal outputted from the second adjustment electrode may have opposite phases to each other. When a distortion occurs in the base portion at the time of vibration of the vibrating arm for driving, electrical signals of the opposite phases can be taken out from the first adjustment electrode and the second adjustment electrode. Therefore, the electrical signals of the opposite phases can offset each other.

(8) Another aspect of the invention relates to a vibrating element including: a base portion which is a non-piezoelectric body; a piezoelectric body for adjustment provided on the base portion; a vibrating arm for driving and a vibrating arm for detection which extend from the base portion; a wiring line which is connected to an electrode provided on the vibrating arm for detection and is arranged in the piezoelectric body for adjustment; and an adjustment electrode which is at least a part of the wiring line and generates an electrical signal with an opposite phase to an output signal of leak vibration of the vibrating arm for detection.

This vibrating element can be used to detect angular velocity. In detecting angular velocity, vibration is excited by the vibrating arm for driving. At this point, if angular velocity motion is applied to the vibrating element, a Coriolis force acts to change the direction of vibration of the vibrating arm for driving. A new force component is generated in a specific direction corresponding to the Coriolis force. This force component causes motion of the vibrating arm for detection. Thus, an output signal corresponding to the force component is outputted from the vibrating arm for detection.

If the shape of the vibrating arm for detection deviates from a designed shape, a leak vibration component is superimposed on the force component in the output signal of the vibrating arm for detection. At this point, the adjustment electrode generates an electrical signal with an opposite phase to the output signal of leak vibration of the vibrating arm for detection. The generated electrical signal is superimposed on the output signal of vibrating arm for detection. Consequently, the leak vibration component is canceled in the output signal of the vibrating arm for detection. The S/N ratio of the output signal is thus improved.

(9) At least a part of the adjustment electrode may be eliminated. When the adjustment electrode is thus eliminated, the area of the piezoelectric body which contacts the adjustment electrode is reduced. Therefore, the piezoelectric body contributing to the generation of the electrical signal with the opposite phase decreases. The amount of electric charge of the electrical signal with the opposite phase can thus be adjusted. Therefore, the leak vibration component can be canceled satisfactorily.

(10) The adjustment electrode may include a wiring line main body connected to the electrode provided on the vibrating arm for detection, and plural electrically conductive pieces which are arrayed in a longitudinal direction of the wiring line main body and are each connected to the wiring line main body via an electrically conductive thin line.

A current of the piezoelectric body is taken out from the electrically conductive pieces and the electrode. The current flows from the electrically conductive pieces to the wiring line main body. When the electrically conductive thin line is eliminated, the current circulating from the electrically conductive pieces to the wiring line main body is reduced. Consequently, the current contributing to the generation of the electrical signal with the opposite phase decreases. The amount of electric charge of the electrical signal with the opposite phase can thus be adjusted. The leak vibration component can be canceled satisfactorily. Since the amount of increase or decrease in current depends on the size of the electrically conductive pieces, the amount of electric charge of the electrical signal with the opposite phase can be adjusted by simple work such as maintaining or eliminating the electrically conductive thin line.

(11) The vibrating element may be used by being incorporated in a gyro sensor. The gyro sensor may include the vibrating element.

(12) The vibrating element may be used by being incorporated in an electronic apparatus. The electronic apparatus may include the vibrating element.

(13) The vibrating element may be incorporated in a moving object for use. The moving object may include the vibrating element.

(14) A specific manufacturing method can be provided in manufacturing a vibrating element. A manufacturing method is for a vibrating element including a base portion including a piezoelectric body at least in a part thereof, a vibrating arm for driving and a vibrating arm for detection which extend from the base portion, and a wiring line which is connected to an electrode provided on the vibrating arm for detection and is arranged in the piezoelectric body. The method may include eliminating at least a part of an adjustment electrode which is at least a part of the wiring line and generates an electrical signal with an opposite phase to an output signal of leak vibration from the vibrating arm for detection.

(15) A specific manufacturing method can be provided in manufacturing a vibrating element. A manufacturing method is for a vibrating element including a base portion which is a non-piezoelectric body, a piezoelectric body for adjustment provided on the base portion, a vibrating arm for driving and a vibrating arm for detection which extend from the base portion, and a wiring line which is connected to an electrode provided on the vibrating arm for detection and is connected to the piezoelectric body for adjustment. The method may include eliminating at least a part of an adjustment electrode which is at least a part of the wiring line and generates an electrical signal with an opposite phase to an output signal of leak vibration of the vibrating arm for detection.

BRIEF DESCRIPTION OF THE DRAWINGS

The invention will be described with reference to the accompanying drawings, wherein like numbers reference like elements.

FIG. 12A is an enlarged plan view schematically showing a face side of a base portion of a vibrating element used in a gyro sensor according to a third embodiment. FIG. 12B is an enlarged perspective plan view schematically showing the configuration of a back side of the base portion, as viewed from the face side.

DESCRIPTION OF EXEMPLARY EMBODIMENTS

Hereinafter, an embodiment of the invention will be described with reference to the accompanying drawings. The following embodiments are not to unduly limit the contents of the invention described in the appended claims. Not all the configurations described in the embodiments are essential as measures for resolution according to the invention.

1. Configuration of Gyro Sensor According to First Embodiment

Figure 1:
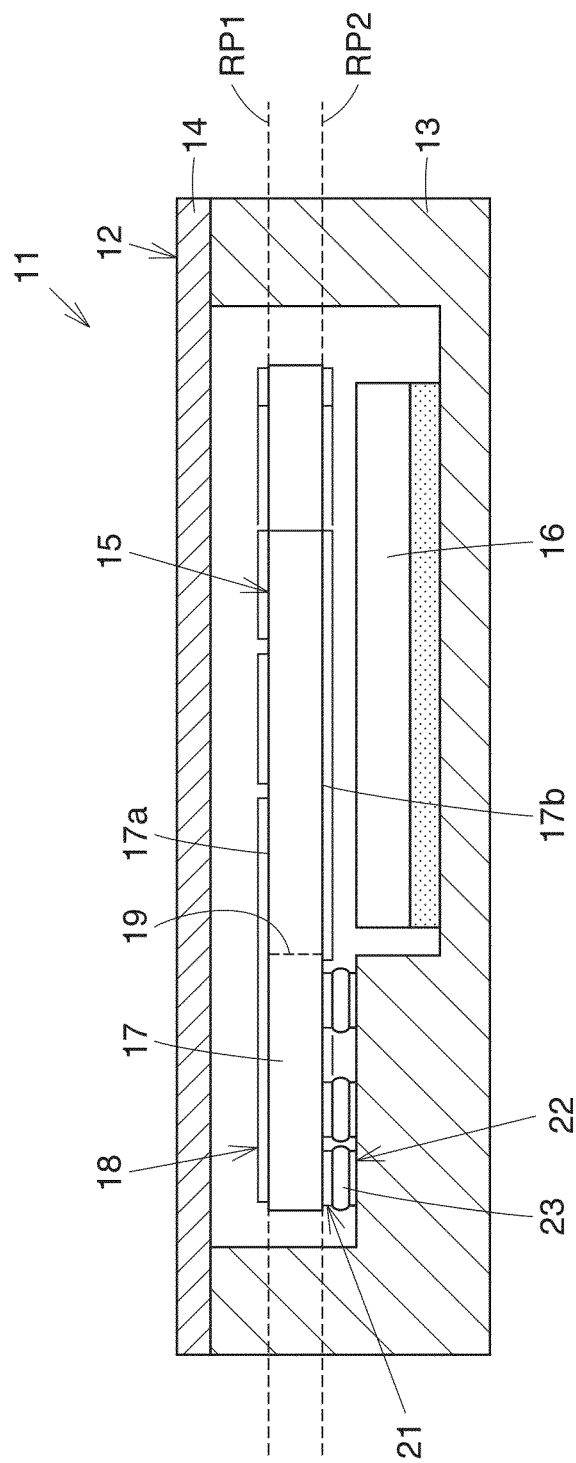
FIG. 1 is a vertical sectional view schematically showing the configuration of a gyro sensor according to a first embodiment.

FIG. 1 schematically shows the configuration of a gyro sensor 11 according to a first embodiment. The gyro sensor 11 has a container 12, for example, in the shape of a box. The container 12 includes a container main body 13 and a lid member 14. The opening of the container main body 13 is airtightly closed by the lid member 14. The inner space of the container 12 can be sealed, for example, as a vacuum. The container 12 functions as a rigid body. At least the lid member 14 can be made of a conductor. When the lid member 14 is grounded, the lid member 14 can exert a shielding effect against electromagnetic waves.

A vibrating element 15 and an IC (integrated circuit) chip 16 are housed in the container 12. The vibrating element 15 and the IC chip 16 are arranged within the inner space of the container 12. The vibrating element 15 includes a main body 17 and an electrically conductive film 18. The electrically conductive film 18 is stacked on the surfaces of the main body 17. The electrically conductive film 18 can be made of an electrically conductive material such as gold (Au), copper (Cu) or other metals. The electrically conductive film 18 can be formed as a thin film or thick film. As is clear from FIG. 1, the main body 17 of the vibrating element 15 has a face side 17a and a back side 17b. The face side 17a spreads within a first reference plane RP1. The back side 17b spreads within a second reference plane RP2. The second reference plane RP2 spreads parallel to the first reference plane RP1. Here, the entire main body 17 is formed by a single piezoelectric body. For example, a crystal can be used as the piezoelectric body.

The vibrating element 15 is supported in a cantilevered form on the container main body 13. In the cantilever support, a fixed portion 19 is marked off at one end of the main body 17. A connection terminal group 21 is arranged on the fixed portion 19. The connection terminal group 21 is formed by a portion of the electrically conductive film 18 spreading on the back side 17b. The connection terminal group 21 includes plural connection terminals, that is, pads made of an electrically conductive material. Details of the connection terminals will be described later. Meanwhile, an electrically conductive terminal group 22 is arranged on a bottom plate of the container main body 13. The electrically conductive terminal group 22 includes plural connection terminals, that is, pads made of an electrically conductive material. The connection terminal group 21 of the vibrating element 15 is joined with the electrically conductive terminal group 22 on the bottom plate. In the joining, an electrically conductive joining material 23, for example, solder bumps or gold bumps, can be used. The vibrating element 15 is thus fixed at the fixed portion 19 to the bottom plate of the container main body 13. The electrically conductive terminal group 22 is connected to the IC chip 16 by wires (not shown) of the electrically conductive film 18. The IC chip 16 can be adhered, for example, to the bottom plate of the container main body 13.

Figure 2:
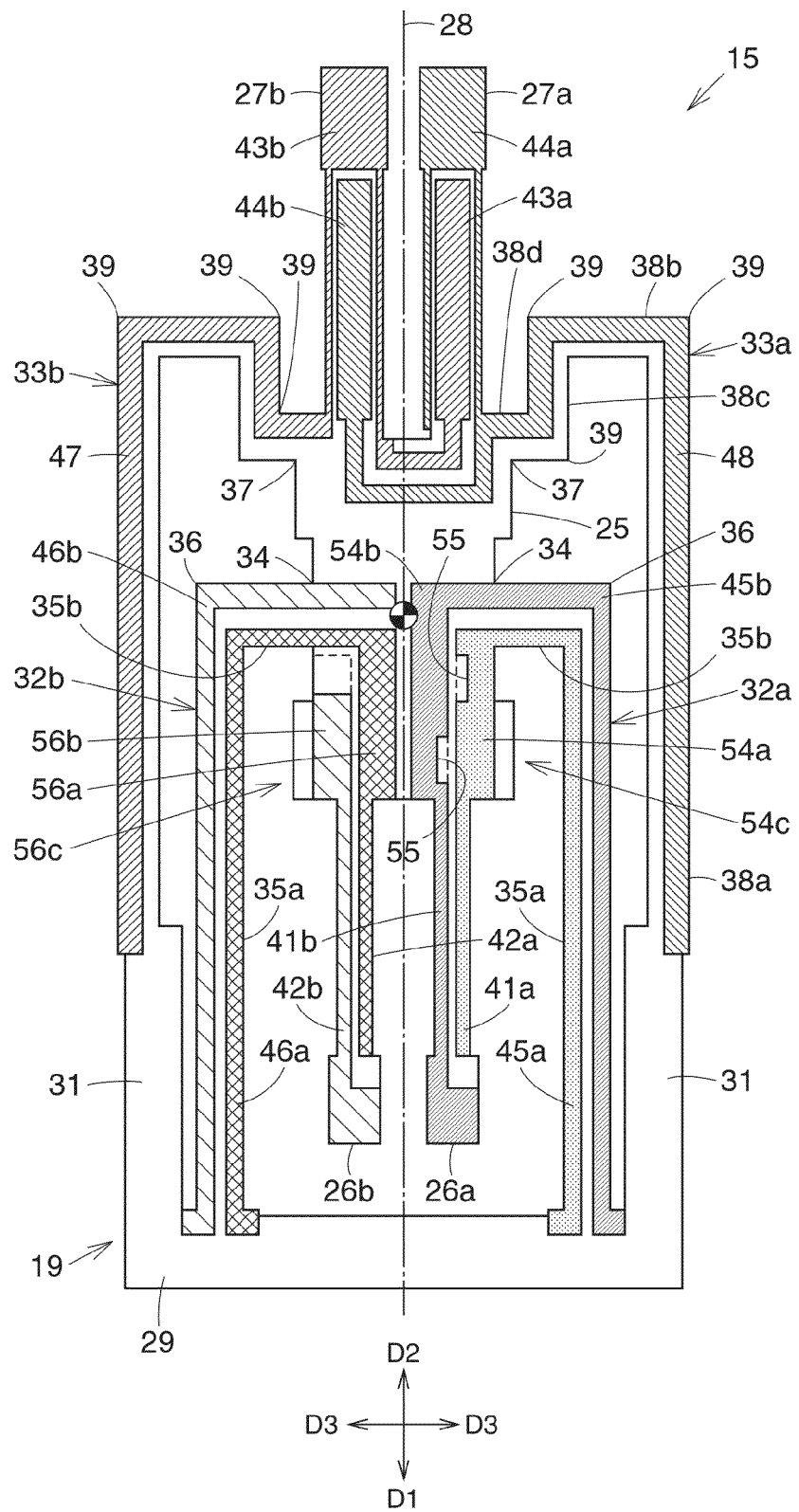
FIG. 2 is an enlarged plan view schematically showing the configuration of a face side of a vibrating element.

As shown in FIG. 2, the main body 17 of the vibrating element 15 has a base portion 25, a pair of first vibrating arms 26a, 26b, and a pair of second vibrating arms 27a, 27b. The pair of first vibrating arms 26a, 26b extends in a first direction D1 from the base portion 25. The first vibrating arms 26a, 26b are supported in a cantilevered form on the base portion 25. The first vibrating arms 26a, 26b extend parallel to each other. The first vibrating arms 26a, 26b are formed with plane symmetry about a symmetry plane 28 which includes the center of gravity of the base portion 25 and is orthogonal to the first and second reference plates RP1, RP2. Here, the pair of first vibrating arms 26a, 26b functions as a pair of vibrating arms for detection. The base portion 25 has predetermined rigidity.

The pair of second vibrating arms 27a, 27b extends in a second direction D2 from the base portion 25. The second direction D2 is equivalent to the direction opposite to the first direction D1. The second vibrating arms 27a, 27b are supported in a cantilevered form on the base portion 25. The second vibrating arms 27a, 27b extend parallel to each other. The second vibrating arms 27a, 27b are formed with plane symmetry about the symmetry plane 28 including the center of gravity of the base portion 25 and orthogonal to the first and second reference planes RP1, RP2. Here, the pair of second vibrating arms 27a, 27b functions as a pair of vibrating arms for driving.

The fixed portion 19 is situated further toward the first direction D1 than the first vibrating arms 26a, 26b. The fixed portion 19 has a first fixed piece 29 and a pair of second fixed pieces 31. The first fixed piece 29 extends in a third direction D3 which is orthogonal to the above symmetry plane 28 and which extends away from the symmetry plane 28. The second fixed pieces 31 are connected to both ends of the first fixed piece 29, respectively. Each of the second fixed pieces 31 extends in the second direction D2. The fixed portion 19 has a predetermined rigidity. The fixed portion 19 functions as a rigid body.

The main body 17 of the vibrating element 15 has at least one first suspension arm 32a, 32b and a pair of second suspension arms 33a, 33b. Here, a pair of first suspension arms 32a, 32b is marked off in the main body 17. The first suspension arms 32a, 32b extend respectively in the second direction D2 from the first fixed piece 29 of the fixed portion 19 in such a way as to lie on both sides of the pair of first vibrating arms 26a, 26b. The distal ends of the first suspension arms 32a, 32b are connected respectively to first connecting parts 34 of the base portion 25. The two first connecting parts 34 are situated on both sides of the pair of first vibrating arms 26a, 26b. Here, each of the first suspension arms 32a, 32b includes a first straight arm 35a and a second straight arm 35b. The first straight arm 35a linearly extends in the second direction D2 from the first fixed piece 29. The second straight arm 35b extends in the third direction D3 from the first connecting part 34. The distal end of the second straight arm 35b is connected to the distal end of the first straight arm 35a. Thus, one flexure part 36 is formed in the first suspension arms 32a, 32b. Here, the second straight arm 35b can extend on one straight line which penetrates the center of gravity of the base portion 25. The bend part 36 may be formed by bending or curving. The expression "on both sides of . . . " here includes a configuration in which a certain object is arranged between two other objects and spaced apart from each of these two other objects. This also applies the following description.

The second suspension arms 33a, 33b extend respectively in the second direction D2 from the second fixed pieces 31 of the fixed portion 19 in such a way as to lie on both sides of the pair of first vibrating arms 26a, 26b and the pair of first suspension arms 32a, 33b. The first vibrating arms 26a, 26b and the first suspension arms 32a, 32b are arranged in the space between the pair of second suspension arms 33a, 33b. The distal ends of the second suspension arms 33a, 33b are connected to second connecting parts 37 of the base portion 25. The second connecting parts 37 are situated further toward the second direction D2 than the first connecting parts 34. Here, each of the second suspension arms 33a, 33b includes a third straight arm 38a, a fourth straight arm. 38b, a fifth straight arm 38c and a sixth straight arm 38d. The third straight arm 38a linearly extends in the second direction D2 from the second fixed piece 31. The sixth straight arm 38d extends in the third direction D3 from the second connecting part 37. The fifth straight arm 38c extends in the second direction D2 from the distal end of the sixth straight arm 38d. The fourth straight arm 38b extends in the direction D3 from the distal end of the fifth straight arm 38c. The distal end of the fourth straight arm 38b is connected to the distal end of the third straight arm 38a. Thus, three flexure parts 39 are formed in the second suspension arms 33a, 33b.

The electrically conductive film 18 forms two pairs of first detection electrodes (electrodes) 41a, 41b and two pairs of second detection electrodes (electrodes) 42a, 42b. The first detection electrodes 41a, 41b are arranged on the one first vibrating arm 26a. Signal electrodes 41a of the first detection electrodes extend from the base of the first vibrating arm 26a toward the distal end thereof, on a face side and a back side of the first vibrating arm 26a. The signal electrodes 41a are connected to each other at the base portion 25. Ground electrodes 41b of the first detection electrodes extend across the total length of the first vibrating arm 26a, on the face side and the back side of the first vibrating arm 26a. The ground electrodes 41b are connected to each other at the distal end of the first vibrating arm 26a. The first vibrating arm 26a is located between the signal electrodes 41a and the ground electrodes 41b. A current is taken out from the signal electrodes 41a and the ground electrodes 41b in accordance with the deformation of the one first vibrating arm 26a.

The second detection electrodes 42a, 42b are arranged on the other first vibrating arm 26b. Signal electrodes 42a of the second detection electrodes extend from the base of the first vibrating arm 26b toward the distal end thereof, on a face side and a back side of the first vibrating arm 26b. The signal electrodes 42a are connected to each other at the base portion 25. Ground electrodes 42b of the second detection electrodes extend across the total length of the first vibrating arm 26b, on the face side and the back side of the first vibrating arm 26b. The ground electrodes 42b are connected to each other at the distal end of the firs vibrating arm 26b. The first vibrating arm 26b is located between the signal electrodes 42a and the ground electrodes 42b. A current is taken out from the signal electrodes 42a and the ground electrodes 42b in accordance with the deformation of the other first vibrating arm 26b.

The electrically conductive film 18 forms two pairs of first drive electrodes 43a, 43b and two pairs of second drive electrodes 44a, 44b. The first drive electrodes 43a are arranged on the one second vibrating arm 27a. The first drive electrodes 43a extend on a face side and a back side of the second vibrating arm 27a on the basal side of the second vibrating arm 27a. The second vibrating arm 27a is located between the first drive electrodes 43a. The first drive electrodes 43b are arranged on the other second vibrating arm 27b. The first drive electrodes 43b extend on the face side and the back side of the second vibrating arm 27b on the free end side of the second vibrating arm 27b. The second vibrating arm 27b is located between the first drive electrodes 43b. The first drive electrodes 43b are connected to the first drive electrodes 43a at the base portion 25.

The second drive electrodes 44a are arranged on the one second vibrating arm 27a. The second drive electrodes 44a extend on the face side and the back side of the second vibrating arm 27a on the free end side of the second vibrating arm 27a. The second vibrating arm 27a is located between the second drive electrodes 44a. The second drive electrodes 44b are arranged on the other second vibrating arm 27b. The second drive electrodes 44b extend on the face side and the back side of the second vibrating arm 27b on the basal end side of the second vibrating arm 27b. The second vibrating arm 27b is located between the second drive electrodes 44b. The second drive electrodes 44b are connected to the second drive electrodes 44a at the base portion 25. When an electric field is applied between the first drive electrodes 43a, 43b and the second drive electrodes 44a, 44b, the second vibrating arms 27a, 27b are deformed.

The electrically conductive film 18 forms first detection wiring lines (wiring lines) 45a, 45b and second detection wiring lines (wiring lines) 46a, 46b. The first detection wiring lines 45a, 45b are arranged on the one first suspension arm 32a. A signal wiring line 45a and a ground wiring line 45b of the first detection wiring lines are arranged on the first suspension arm 32a across the total length of the one first suspension arm 32a. The signal wiring line 45a is connected to the signal electrode 41a. The ground wiring line 45b is connected to the ground electrode 41b. The second detection wiring lines 46a, 46b are arranged on the other first suspension arm 32b. A signal wiring line 46a and a ground wiring line 46b of the second detection wiring lines are arranged on the first suspension arm 32b across the total length of the first suspension arm 32b. The signal wiring line 46a is connected to the signal electrode 42a. The ground wiring line 46b is connected to the ground electrode 42b.

The electrically conductive film 18 forms a first drive wiring line 47 and a second drive wiring line 48. The first drive wiring line 47 is arranged on the one second suspension arm 33b. The first drive wiring line 47 is arranged on the second suspension arm 33b across the total length of the second suspension arm 33b. The first drive wiring line 47 is connected to the first drive electrodes 43a, 43b. The second drive wiring line 48 is arranged on the other second suspension arm 33a. The second drive wiring line 48 is arranged on the second suspension arm 33a across the total length of the second suspension arm 33a. The second drive wiring line 48 is connected to the second drive electrodes 44a, 44b.

Figure 3:
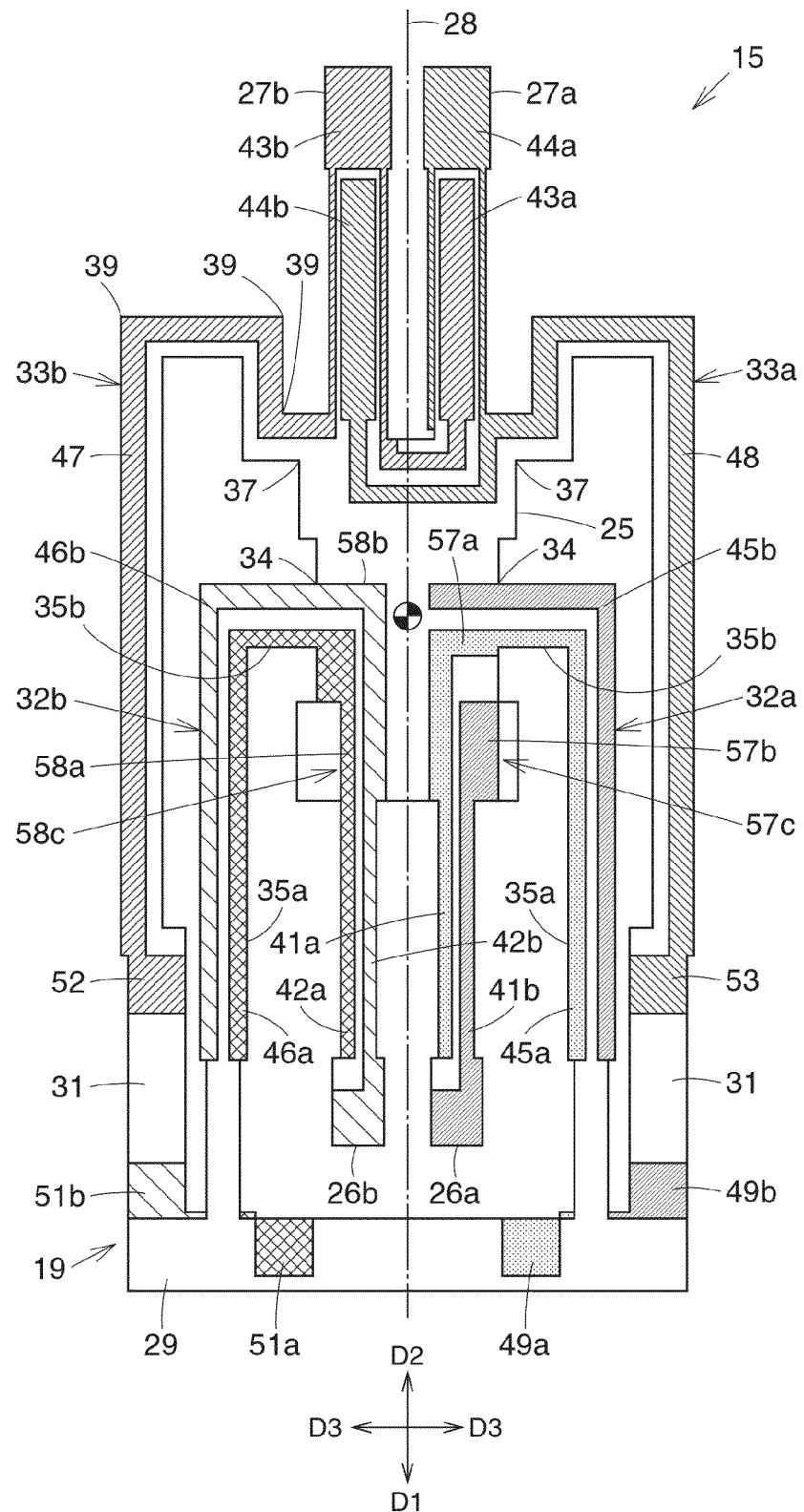
FIG. 3 is an enlarged perspective plan view schematically showing the configuration of a back side of the vibrating element, as viewed from the face side.

As shown in FIG. 3, the connection terminal group 21 includes a pair of first detection terminals 49a, 49b and a pair of second detection terminals 51a, 51b. A signal terminal 49a of the first detection terminals and a signal terminal 51a of the second detection terminals are arranged on the first fixed piece 29. The signal terminals 49a, 51a are arranged inside the pair of first suspension arms 32a, 32b. The signal terminal 49a of the first detection terminals is connected to the signal line 45a of the first detection wiring lines. The signal terminal 51a of the second detection terminals is connected to the signal line 46a of the second detection wiring lines. The signal terminals 49a, 51a are formed as pads made of an electrically conductive material.

A ground terminal 49b of the first detection terminals and a ground terminal 51b of the second detection terminals are arranged respectively on the second fixed pieces 31. The ground terminal 49b of the first detection terminals is connected to the ground wiring line 45b of the first detection wiring lines. The ground terminal 51b of the second detection terminals is connected to the ground wiring line 46b of the second detection wiring lines. The ground terminals 49b, 51b are formed as pads made of an electrically conductive material.

The connection terminal group 21 further includes a first drive terminal 52 and a second drive terminal 53. The first drive terminal 52 and the second drive terminal 53 are arranged respectively on the second fixed pieces 31. The first drive terminal 52 is connected to the first drive wiring line 47. The second drive terminal 53 is connected to the second drive wiring line 48. The ground terminal 51b of the second detection terminals is arranged between the first drive terminal 52 and the signal terminal 51a of the second detection terminals. The ground terminal 49b of the first detection terminals is arranged between the second drive terminal 53 and the signal terminal 49a of the first detection terminals.

As shown in FIG. 2, the electrically conductive film 18 forms first electrode wiring lines (adjustment electrodes) 54a, 54b on the surface of the base portion 25 on the face side 17a of the main body 17. The first electrode wiring lines 54a, 54b are laid along the surface of the base portion 25. The one first electrode wiring line 54a extends from the first detection electrode 41a and is connected to the first detection wiring line 45a. The other first electrode wiring line 54b extends from the first detection electrode 41b and is connected to the first detection wiring line 45b. The first electrode wiring lines 54a, 54b are parallel to each other with a predetermined space between each other. Thus, a first tuning electrode pair 54c is formed by the first electrode wiring lines 54a, 54b spaced apart from each other on the surface of the base portion 25. Here, a "cut-out 55" is formed in the contours of the first electrode wiring lines 54a, 54b. Consequently, the space between the contours of the first electrode wiring lines 54a, 54b is partly expanded. As the "cut-out 55" in the contours, for example, a laser scar is formed.

The electrically conductive film 18 forms second electrode wiring lines (adjustment electrodes) 56a, 56b on the surface of the base portion 25 on the face side 17a of the main body 17. The second electrode wiring lines 56a, 56b are laid along the surface of the base portion 25. The one second electrode wiring line 56a extends from the second detection electrode 42a and is connected to the second detection wiring line 46a. The other second electrode wiring line 56b extends from the second detection electrode 42b and comes to an end. The second electrode wiring lines 56a, 56b are parallel to each other with a predetermined space between each other. Thus, a second tuning electrode pair 56c is formed by the second electrode wiring lines 56a, 56b spaced apart from each other on the surface of the base portion 25. Here, the length of the second electrode wiring line 56b is adjusted. The distal end of the second electrode wiring line 56b is eliminated. Consequently, the area of the surface of the base portion 25 located between the second electrode wiring lines 56a, 56b is reduced. For example, a laser scar is formed on an extended line from the distal end of the second electrode wiring line 56b.

As shown in FIG. 3, the electrically conductive film 18 forms third electrode wiring lines (adjustment electrodes) 57a, 57b on the surface of the base portion 25 on the back side 17b of the main body 17. The third electrode wiring lines 57a, 57b are laid along the surface of the base portion 25. The one third electrode wiring line 57a extends from the first detection electrode 41a and is connected to the first detection wiring line 45a. The other third electrode wiring line 57b extends from the first detection electrode 41b and comes to an end. The third electrode wiring lines 57a, 57b are parallel to each other with a predetermined space between each other. Thus, a third tuning electrode pair 57c is formed by the third electrode wiring lines 57a, 57b spaced apart from each other on the surface of the base portion 25. Here, the third electrode wiring lines 57a, 57b are left in the stacked form. No laser scars are formed in the contours of the third electrode wiring lines 57a, 57b.

The electrically conductive film 18 forms fourth electrode wiring lines (adjustment electrodes) 58a, 58b on the surface of the base portion 25 on the back side 17b of the main body 17. The fourth electrode wiring lines 58a, 58b are laid along the surface of the base portion 25. The one fourth electrode wiring line 58a extends from the second detection electrode 42a and is connected to the second detection wiring line 46a. The other fourth electrode wiring line 58b extends from the second detection electrode 42b and is connected to the second detection wiring line 46b. The fourth electrode wiring lines 58a, 58b are parallel to each other with a predetermined space between each other. Thus, a fourth tuning electrode pair 58c is formed by the fourth electrode wiring lines 58a, 58b spaced apart from each other on the surface of the base portion 25. Here, the fourth electrode wiring lines 58a, 58b are left in the stacked form. No laser scars are formed in the contours of the fourth electrode wiring lines 58a, 58b.

2. Operation of Gyro Sensor According to First Embodiment

Figure 4:
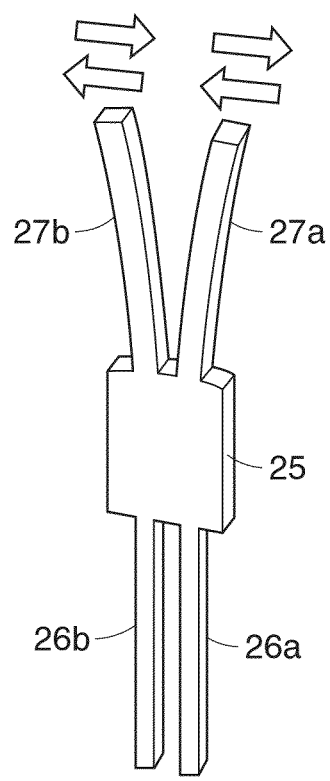
FIG. 4 is a perspective view of the vibrating element schematically showing how second vibrating arms, that is, vibrating arms for driving, vibrate.

Next, the operation of the gyro sensor 11 will be described briefly. As shown in FIG. 4, vibration is excited by the second vibrating arms 27a, 27b in detecting angular velocity. When exciting vibration, a drive signal is inputted to the vibrating element 15 from the first drive terminal 52 and the second drive terminal 53. Consequently, between the first drive electrodes 43a, 43b and the second drive electrodes 44a, 44b, an electric field acts on the main body 17 of the vibrating element 15. As a waveform with a specific frequency is inputted, the second vibrating arms 27a, 27b flex between the first reference plane RP1 and the second reference plane RP2. The second vibrating arms 27a, 27b repeat moving toward and away from each other.

Figure 5:
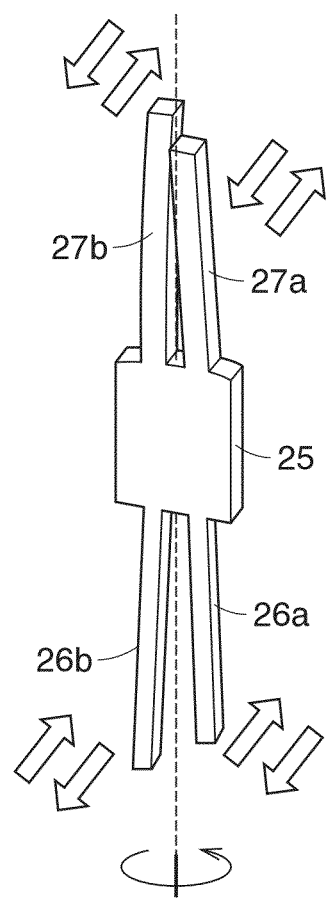
FIG. 5 is a perspective view of the vibrating element schematically showing how first vibrating arms, that is, vibrating arms for detection, vibrate.

When an angular velocity motion is applied to the gyro sensor 11, the direction of vibration of the second vibrating arms 27a, 27b is changed by the action of a Coriolis force, as shown in FIG. 5. So-called walk-mode excitation is generated. At this point, a new force component is generated parallel to the symmetry plane 28, corresponding to the Coriolis force. The second vibrating arms 27a, 27b flex parallel to the symmetry plane 28. The second vibrating arms 27a, 27b swing around the center of gravity of the base portion 25.

The walk-mode excitation of the second vibrating arms 27a, 27b propagates to the first vibrating arms 26a, 26b from the base portion 25. Consequently, a motion of the first vibrating arms 26a, 26b is generated based on the force component parallel to the symmetry plane 28. The first vibrating arms 26a, 26b flex parallel to the symmetry plane 28. The first vibrating arms 26a, 26b swing around the center of gravity of the base portion 25. In accordance with this flexure, an electric field based on a piezoelectric effect is generated in the first vibrating arms 26a, 26b and an electric charge is generated. The flexure of the first vibrating arm 26a generates a potential difference between the signal electrode 41a and the ground electrode 41b of the first detection electrodes. Similarly, the flexure of the first vibrating arm 26b generates a potential difference between the signal electrode 42a and the ground electrode 42b of the second detection electrodes. At this point, if the shape of the first vibrating arms 26a, 26b is deviated, for example, from a designed shape based on processing errors, a leak vibration component is superimposed on the Coriolis force component in the output signal of the first vibrating arms 26a, 26b.

Figure 6:
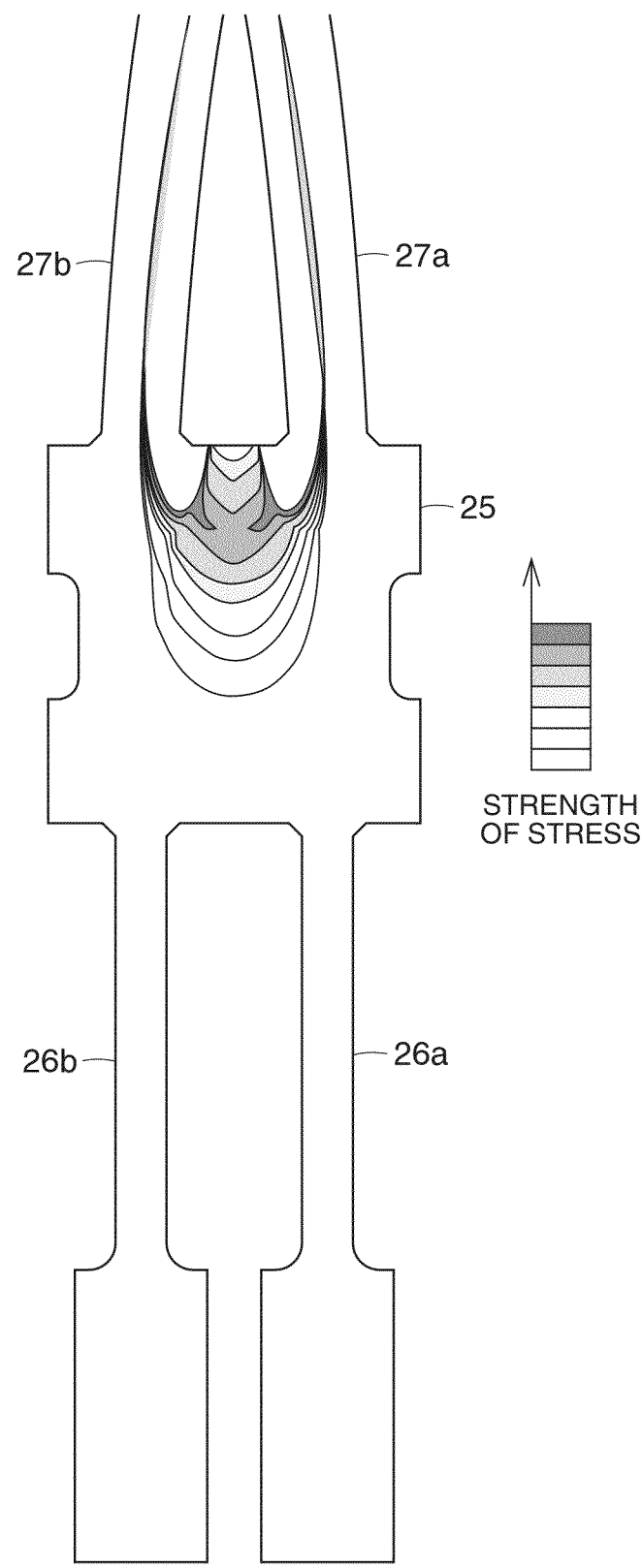
FIG. 6 is a plan view showing stress distribution of the vibrating element when the second vibrating arms vibrate.
Figure 7:
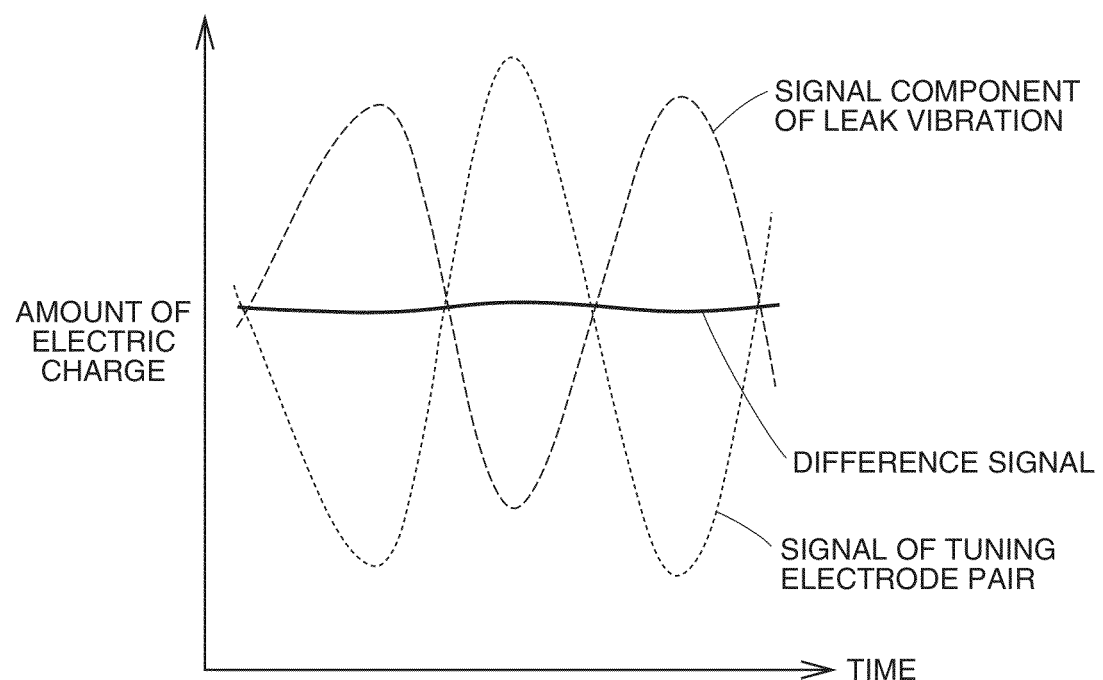
FIG. 7 is a graph showing the relation between an output signal of leak vibration and an output signal of a tuning electrode pair.

As shown in FIG. 6, stress is formed in the base portion 25 when the second vibrating arms 27a, 27b vibrate. In the base portion 25, an electric field is generated based on a piezoelectric effect, and an electric charge is generated. Therefore, electric charge is generated based on a piezoelectric effect by the first to fourth tuning electrode pairs 54c, 56c, 57c, 58c and a potential difference is generated by the first to fourth tuning electrode pairs 54c, 56c, 57c, 58c. This potential difference can generate an electrical signal with an opposite phase to an output signal of leak vibration of the first vibrating arms 26a, 26b, as shown in FIG. 7. The generated electrical signal is superimposed on the output signal of the first vibrating arms 26a, 26b. Consequently, the leak vibration component in the output signal of the first vibrating arms 26a, 26b is canceled. Thus, the S/N ratio of the output signal is improved. Here, as is clear from FIG. 6, since the amount of electric charge in the base portion 25 differs from area to area, the arrangement of the first to fourth tuning electrode pairs 54c, 56c, 57c, 58c may be adjusted according to the amount of electric charge of leak vibration. Particularly, since greater stress is generated in areas closer to the second vibrating arms 27a, 27b, the amount of electric charge can be roughly adjusted by tuning electrode pairs located in areas close to the second vibrating arms 27a, 27b and the amount of electric charge can be further fine-tuned by tuning electrode pairs located in areas far from the second vibrating arms 27a, 27b.

For example, in the second tuning electrode pair 56c, the second electrode wiring line 56b is at least partly eliminated. The distal end of the second electrode wiring line 56b is eliminated. Consequently, the area of the surface of the base portion 25 located between the second electrode wiring lines 56a, 56b is reduced. Thus, the piezoelectric body contributing to the generation of the electrical signal with the opposite phase is reduced. In this way, the amount of electric charge of the electrical signal with the opposite phase can be adjusted. Therefore, the leak vibration component can be canceled satisfactorily.

For example, in the first tuning electrode pair 54c, the first electrode wiring lines 54a, 54b are at least partly eliminated. The "cut-out 55" is formed in the contours of the first electrode wiring lines 54a, 54b. Consequently, the space between the contours of the first electrode wiring lines 54a, 54b is partly expanded. As the space between the contours is thus expanded, the current circulating between the first electrode wiring lines 54a, 54b decreases. Thus, the current contributing to the generation of the electrical signal with the opposite phase is reduced. In this way, the amount of electric charge of the electrical signal with the opposite phase can be adjusted. Therefore, the leak vibration component can be canceled satisfactorily.

In addition, the first tuning electrode pair 54c and the second tuning electrode pair 56c are arranged on the surface of the base portion 25 on the face side 17a. The third tuning electrode pair 57c and the fourth tuning electrode pair 58c are arranged on the surface of the base portion 25 on the back side 17b. Consequently, the arrangement area for tuning electrode pairs is doubled, compared with the case where tuning electrode pairs are arranged only on one of the face side 17a and the back side 17b. Therefore, the range of adjustment of the electrical signal can be expanded. Alternatively, the amount of electric charge of the electrical signal can be adjusted finely. However, tuning electrode pairs may be formed on the face side 17a alone.

3. Manufacturing Method for Gyro Sensor According to First Embodiment

Figure 8:
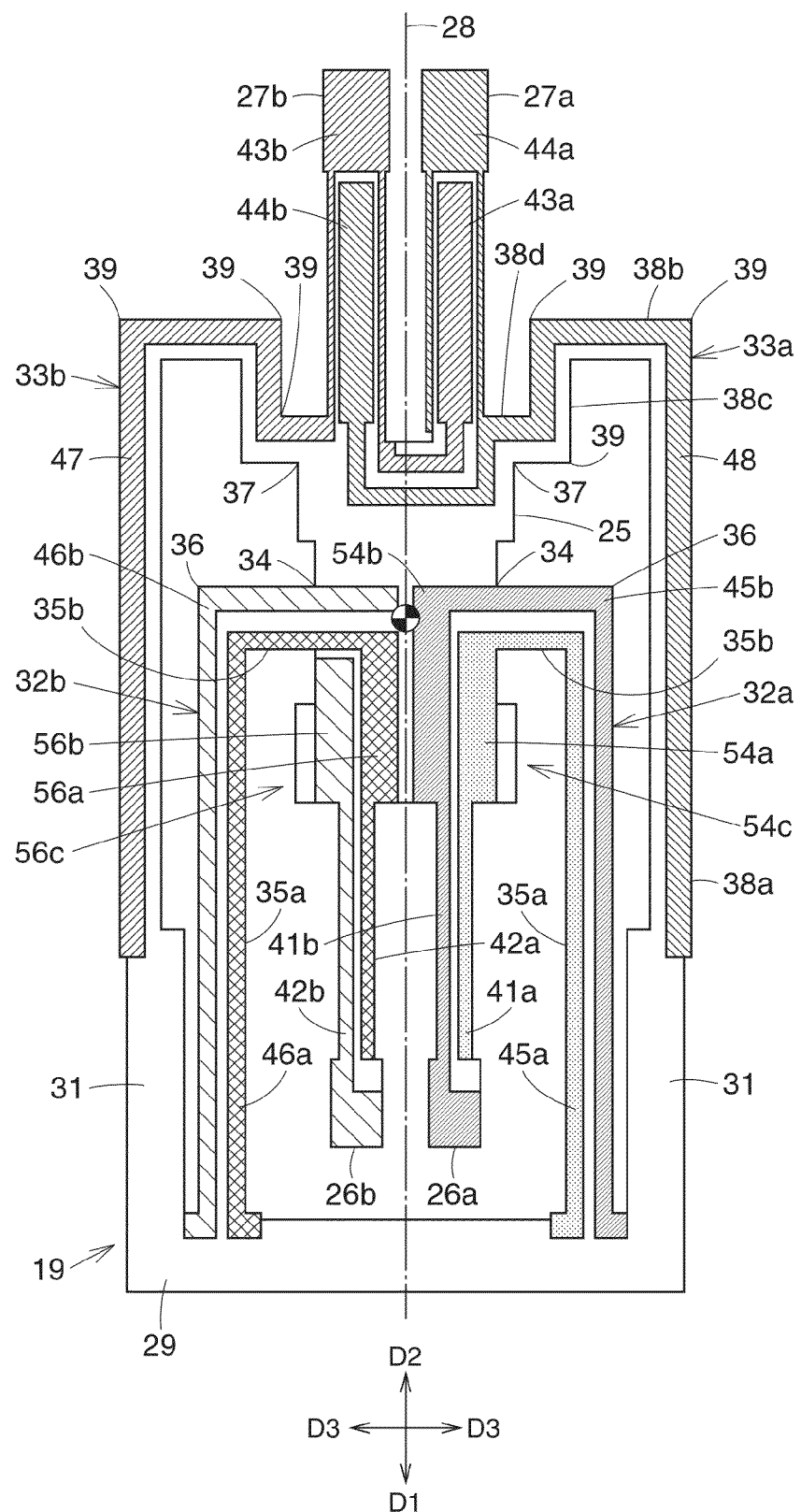
FIG. 8 is an enlarged plan view schematically showing the vibrating element before tuning processing, corresponding to the FIG. 2.

In manufacturing the gyro sensor 11, the vibrating element 15 is manufactured. The main body 17 of vibrating element 15 is sliced out of a crystal body. The electrically conductive film 18 is formed on the main body 17. As shown in FIG. 8, the electrically conductive film 18 is formed in a pattern according to design. For example, a photolithographic technique can be used to form the electrically conductive film 18.

The container 12 is prepared. The IC chip 16 is fixed within the container main body 13. Subsequently, the vibrating element 15 is fixed within the container main body 13. The connection terminal group 21 is joined with the electrically conductive terminal group 22. The first detection terminals 49a, 49b, the second detection terminals 51a, 51b, and the first and second drive terminals 52, 53 are accepted respectively by corresponding connection terminals. Thus, the vibrating element 15 is electrically connected to the IC chip 16.

The gyro sensor 11 is tuned at this point. In tuning, a control signal is supplied to the IC chip 16. The IC chip starts detecting angular velocity. As is the above description, vibration is excited by the second vibrating arms 27a, 27b. If angular velocity motion does not act, no Coriolis force is generated in the second vibrating arms 27a, 27b. Meanwhile, stress is formed in the base portion 25 according to the vibration of the second vibrating arms 27a, 27b. A potential difference is generated by the first to fourth tuning electrode pairs 54c, 56c, 57c, 58c. At this time, if the gyro sensor 11 detects angular velocity="0" (zero), the opening of the container main body 13 is airtightly closed by the lid member 14. The inner space of the container 12 is sealed. The manufacturing of the gyro sensor 11 is thus completed. An electrical signal of leak vibration is completely canceled by the electrical signal of the first to fourth tuning electrode pairs 54c, 56c, 57c, 58c.

If the gyro sensor 11 does not detect angular velocity="0", it may be considered that there is a discrepancy between the amount of electric charge of leak vibration and the amount of electric charge of the first to fourth tuning electrode pairs 54c, 56c, 57c, 58c. In this case, the first to fourth electrode wiring lines 54a, 54b, 56a, 56b, 57a, 57b, 58a, 58b are selectively eliminated in the first to fourth tuning electrode pairs 54c, 56c, 57c, 58c according to the measured amount of electric charge. For example, a laser can be used for the elimination. A laser scar is selectively formed on the first to fourth tuning electrode pairs 54c, 56c, 57c, 58c. The amount of electric charge is adjusted by the first to fourth tuning electrode pairs 54c, 56c, 57c, 58c. Consequently, if the gyro sensor 11 detects angular velocity="0" (zero), the opening of the container main body 13 is airtightly closed by the lid member 14. The inner space of the container 12 is sealed. The manufacturing of the gyro sensor 11 is thus completed.

4. Gyro Sensor According to Second Embodiment

Figure 9:
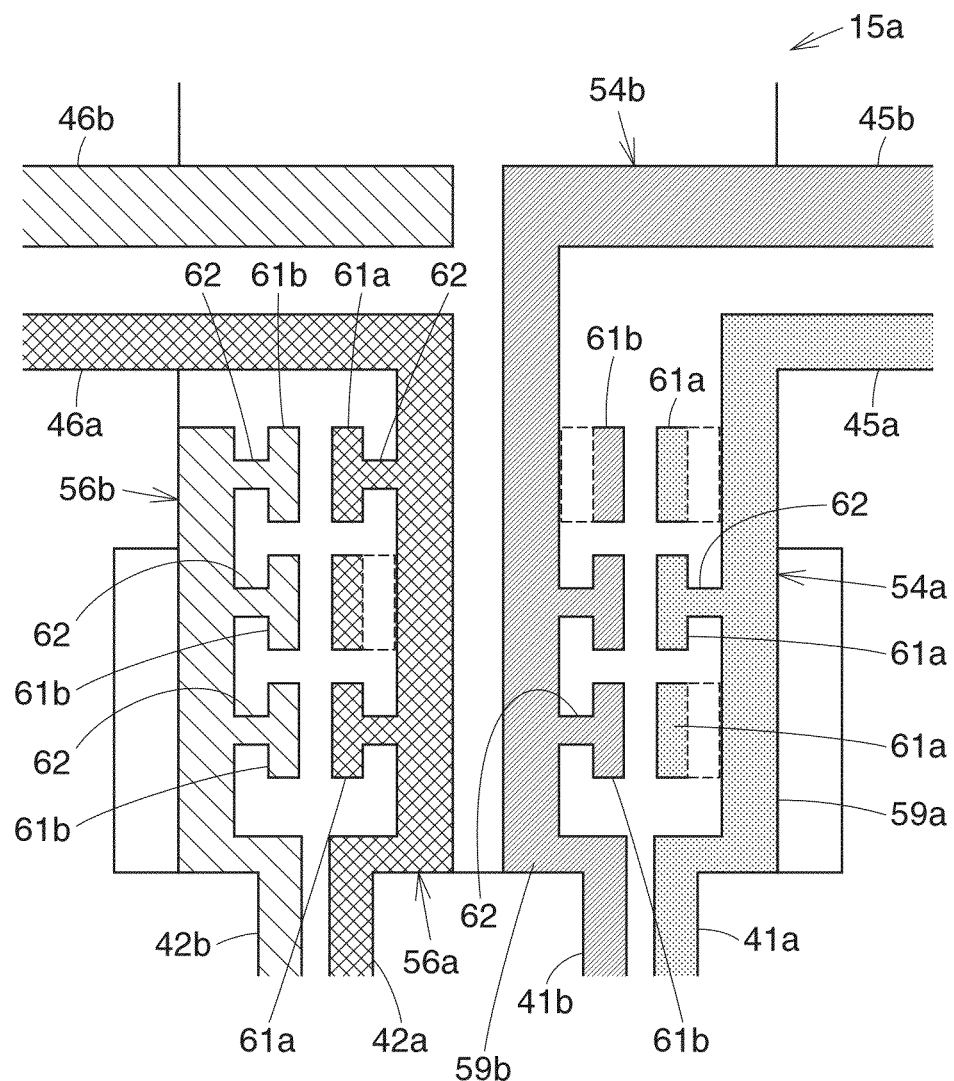
FIG. 9 is an enlarged plan view schematically showing a base portion of a vibrating element used in a gyro sensor according to a second embodiment.

In a gyro sensor 11 according to a second embodiment, a vibrating element 15a is used in place of the above vibrating element 15. In this vibrating element 15a, the first electrode wiring lines 54a, 54b include a first wiring line main body 59a and a second wiring line main body 59b, as shown in FIG. 9. The first wiring line main body 59a extends from the first detection electrode 41a and is connected to the first detection wiring line 45a. The second wiring line main body 59b extends from the first detection electrode 41b and is connected to the first detection wiring line 45b. Between the first wiring line main body 59a and the second wiring line main body 59b, plural first electrically conductive pieces 61a are arranged along the first wiring line main body 59a, and plural second electrically conductive pieces 61b are arranged along the second wiring line main body 59b. The first electrically conductive pieces 61a and the second electrically conductive pieces 61b are arranged parallel to each other with a predetermined space between each other. Each of the first electrically conductive pieces 61a is connected to the first wiring line main body 59a via an electrically conductive thin line 62. Each of the second electrically conductive pieces 61b is connected to the second wiring line main body 59b via an electrically conductive thin line 62. Thus, a first tuning electrode pair 63 is formed by the first electrically conductive pieces 61a and the second electrically conductive pieces 61b spaced apart from each other on the surface of the base portion 25.

Figure 10:
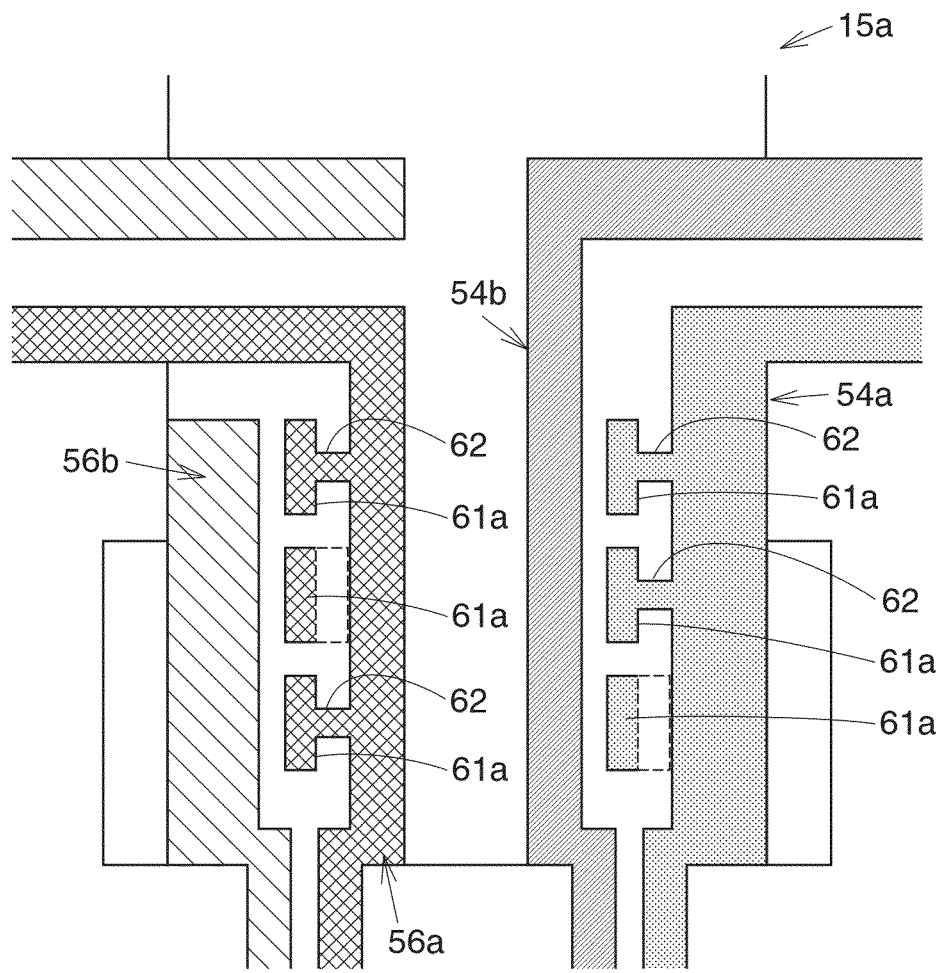
FIG. 10 is an enlarged plan view schematically showing a base portion of a vibrating element according to a modification.

Here, for each pair of the first electrically conductive piece 61a and the second electrically conductive piece 61b, one or both of the electrically conductive thin lines 62 can be eliminated. For example, when the electrically conductive thin line 62 is eliminated from the second electrically conductive piece 62b, the current of the piezoelectric body is taken out from the first electrically conductive piece 61a and the second wiring line main body 59b. Since the distance between the first electrically conductive piece 61a and the second wiring line main body 59b is longer than the distance between the first electrically conductive piece 61a and the second electrically conductive piece 61b, the circulating current decreases. Therefore, the current contributing to the generation of an electrical signal with the opposite phase is reduced. Similarly, the electrically conductive thin line 62 may be eliminated from the first electrically conductive piece 61a. When the electrically conductive thin lines 62 are eliminated from the first electrically conductive piece 61a and the second electrically conductive piece 61b, the current of the piezoelectric body is taken out from the first wiring line main body 59a and the second wiring line main body 59b. Since the distance between the first wiring line main body 59a and the second wiring line main body 59b is longer than the distance between the first electrically conductive piece 61a and the second electrically conductive piece 61b, the circulating current decreases to a greater extent. Consequently, the current contributing to the generation of the electrical signal with the opposite phase is reduced to a greater extent. Thus, the amount of electric charge of the electrical with the opposite phase can be adjusted. Therefore, the leak vibration component can be canceled satisfactorily. Since the amount of increase or decrease in the amount of electric charge depends on the size of the electrically conductive pieces 61a, 61b, the amount of electric charge of the electrical signal with the opposite phase can be adjusted by simple work such as maintaining or eliminating the electrically conductive thin lines 62. The other parts of the configuration can be similar to the above vibrating element 15. The electrically conductive pieces 61a, 61b may simply be connected to one of the first electrode wiring lines 54a, 54b or one of the second electrode wiring lines 56a, 56b, as shown in FIG. 10.

Figure 11:
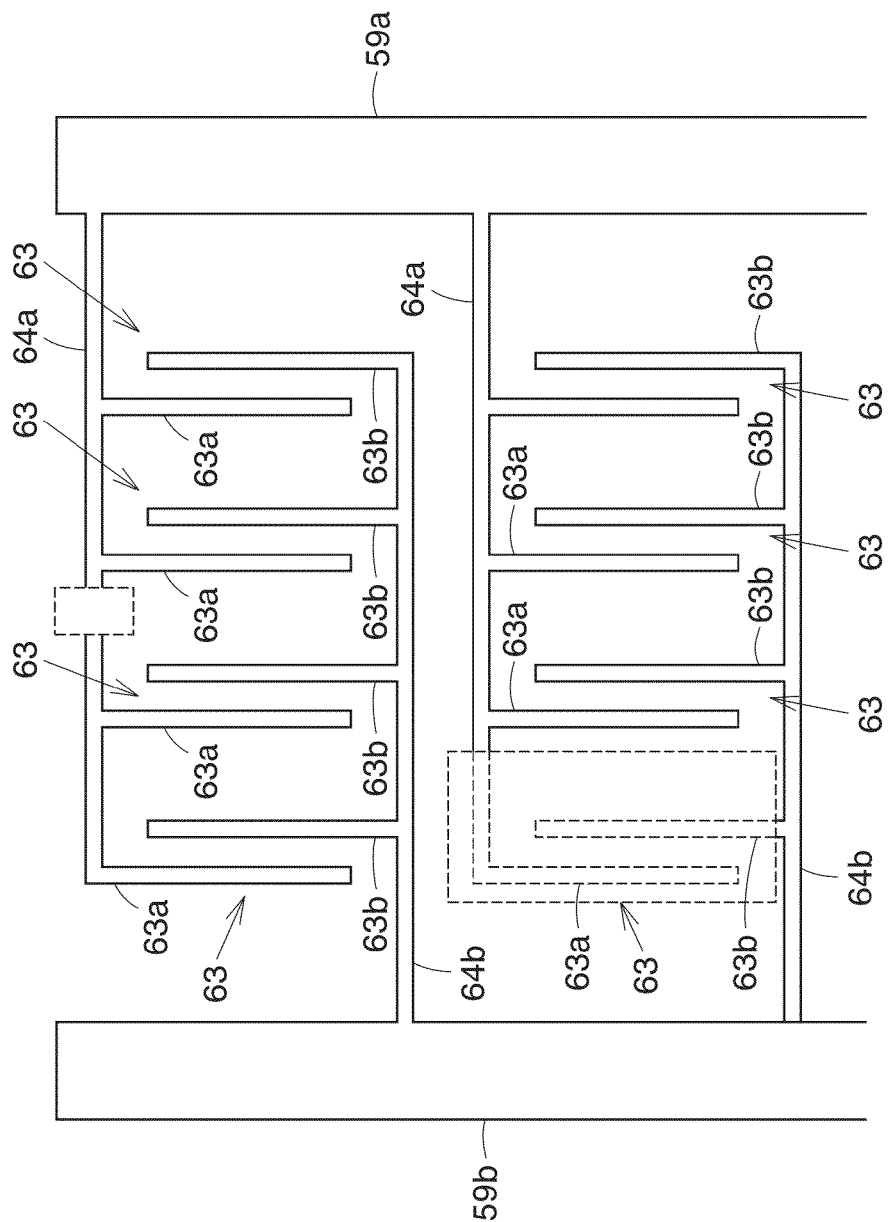
FIG. 11 is an enlarged plan view schematically showing a base portion of a vibrating element according to another modification.

Moreover, between the first wiring line main body 59a and the second wiring line main body 59b, plural pairs of parallel electrically conductive line 63 may be arranged in place of the first electrically conductive pieces 61a and the second electrically conductive pieces 61b, as shown in FIG. 11. In each pair, a first electrically conductive line 63a and a second electrically conductive line 63b are spaced apart from each other on the surface of the base portion 25. Thus, the first electrically conductive line 63a and the second electrically conductive line 63b can form the first tuning electrode pair 54c. The first electrically conductive line 63a is connected to the first wiring line main body 59a via a first common electrically conductive line 64a. The second electrically conductive line 63b is connected to the second wiring line main body 59b via a second common electrically conductive line 64b. The combination of the first electrically conductive line 63a and the first common electrically conductive line 64a and the combination of the second electrically conductive line 63b and the second common electrically conductive line 64b can form a so-called comb-teeth shape. When the first electrically conductive line 63a and the second electrically conductive line 63b are eliminated, the area of the piezoelectric body located between the first electrically conductive line 63a and the second electrically conductive 63b is reduced. Consequently, the piezoelectric body contributing to the generation of the electrical signal with the opposite phase decreases. Thus, the amount of electric charge of the electrical signal with the opposite phase can be adjusted. Therefore, the leak vibration component can be canceled satisfactorily. The common electrically conductive lines 64a, 64b may be disconnected, instead of eliminating the first electrically conductive line 63a and the second electrically conductive line 63b.

5. Gyro Sensor According to Third Embodiment

In a gyro sensor 11 according to a third embodiment, a vibrating element 15b is used in place of the above vibrating element 15. In this vibrating element 15b, the third electrode wiring lines 57a, 57b are arranged on the back side of the first electrode wiring lines 54a, 54b, as shown in FIGS. 12A and 12B. The arrangement area for the first electrode wiring lines 54a, 54b and the arrangement area for the third electrode wiring lines 57a, 57b at least partly shift relatively to each other, parallel to the face side 17a of the main body 17. Consequently, the first tuning electrode pair 54c of the first electrode wiring lines 54a, 54b spreads to outside of the contour of a projected image 65a. The projected image 65a is formed by the third electrode wiring lines 57a, 57b projected on the face side 17a of the main body 17. The "cut-out 55" of the first electrode wiring lines 54a, 54b is formed outside of the contour of the projected image 65a. Similarly, the fourth electrode wiring lines 58a, 58b are arranged on the back side of the second electrode wiring lines 56a, 56b. The second tuning electrode pair 56c of the second electrode wiring lines 56a, 56b spreads to outside of the contour of a projected image 65b. The projected image 65b is formed by the fourth electrode wiring lines 58a, 58b projected on the face side 17a of the main body 17. The other parts of the configurations can be similar to the above vibrating element 15.

Figure 13:
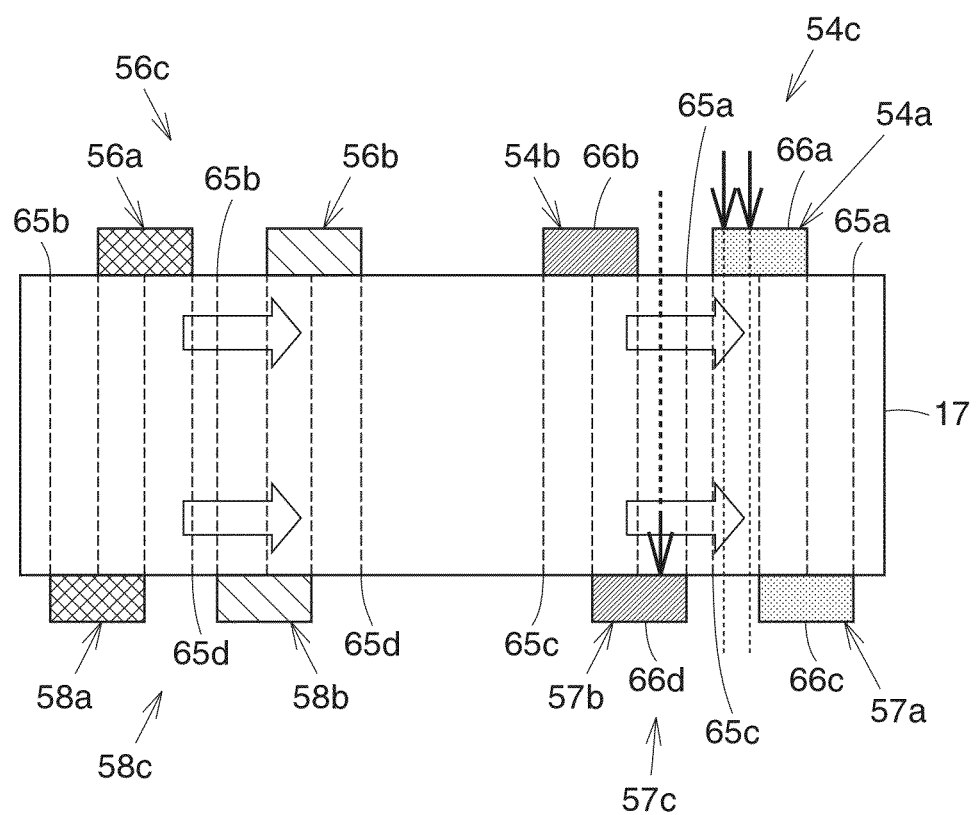
FIG. 13 is a cross-sectional view taken along line 13-13 in FIGS. 12A and 12B.

In this vibrating element 15b, the first tuning electrode pair 54c includes a tuning electrode (adjustment electrode) 66a connected to the signal terminal 49a of the first detection terminals, and a tuning electrode (adjustment electrode) 66b connected to the ground terminal 49b of the first detection terminals. Meanwhile, the third tuning electrode pair 57c includes a tuning electrode (adjustment electrode) 66c arranged on the back side of the tuning electrode 66a and connected to the signal terminal 49a of the first detection terminals, and a tuning electrode (adjustment electrode) 66d arranged on the back side of the tuning electrode 66b and connected to the signal terminal 49b of the first detection terminals. As shown in FIG. 13, when a distortion occurs in the base portion 25 at the time of vibration of the second vibrating arms 27a, 27b, electrical signals in phase with each other can be taken out from the first tuning electrode pair 54c and the third tuning electrode pair 57c. Therefore, the amount of electric charge of the electrical signal is doubled. Also the second tuning electrode pair 56c and the fourth tuning electrode pair 58c are configured similarly.

In the vibrating element 15b, the "cut-out 55" is formed in the first electrode wiring lines in tuning processing. The first electrode wiring line 54a is partly eliminated to form the "cut-out 55". As shown in FIG. 13, since the first tuning electrode pair 54c is eliminated outside of the contour of the projected image 65a, even if a laser beam is transmitted through the transparent main body 17, the laser beam does not strike the third electrode wiring lines 57a, 57b. The third electrode wiring lines 57a, 57b can be maintained as designed. Simply a laser can be used for the elimination.

On the contrary, the third tuning electrode pair 57c of the third electrode wiring lines 57a, 57b can spread to outside of the contour of a projected image 65c. The projected image 65c is formed by the first electrode wiring lines 54a, 54b projected on the back side 17b of the main body 17. Similarly, the fourth tuning electrode pair 58c of the fourth electrode wiring lines 58a, 58b can spread to outside of the contour of a projected image 65d. The projected image 65d is formed by the second electrode wiring lines 56a, 56b projected on the back side 17b of the main body 17. The laser beam can reach the third electrode wiring lines 57a, 57b and the fourth electrode wiring lines 58a, 58b on the back side 17b without striking the first electrode wiring lines 54a, 54b and the second electrode wiring lines 56a, 56b on the face side 17a. The third tuning electrode pair 57c and the fourth tuning electrode pair 58c can be partly eliminated from the face side of the vibrating element 15b.

6. Gyro Sensor According to Fourth Embodiment

Figure 14B:
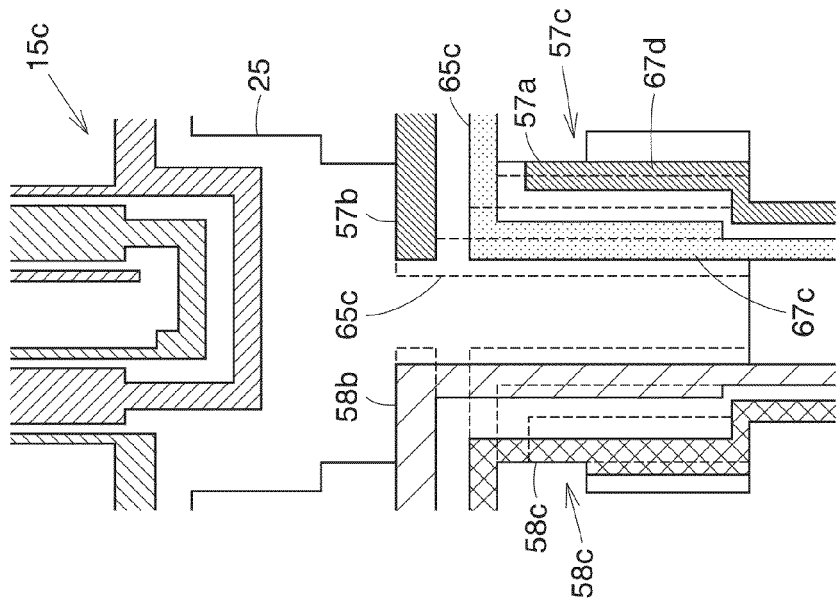
FIG. 14B is an enlarged perspective plan view schematically showing the configuration of a back side of the base portion, as viewed from the face side.
Figure 14A:
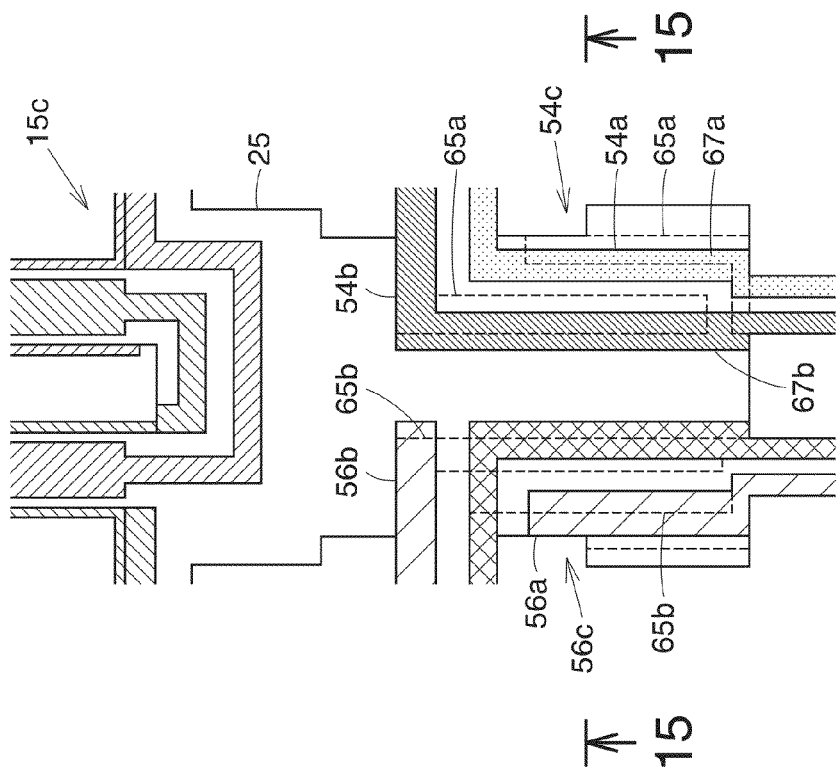
FIG. 14A is an enlarged plan view schematically showing a face side of a base portion of a vibrating element used in a gyro sensor according to a fourth embodiment.
Figure 15:
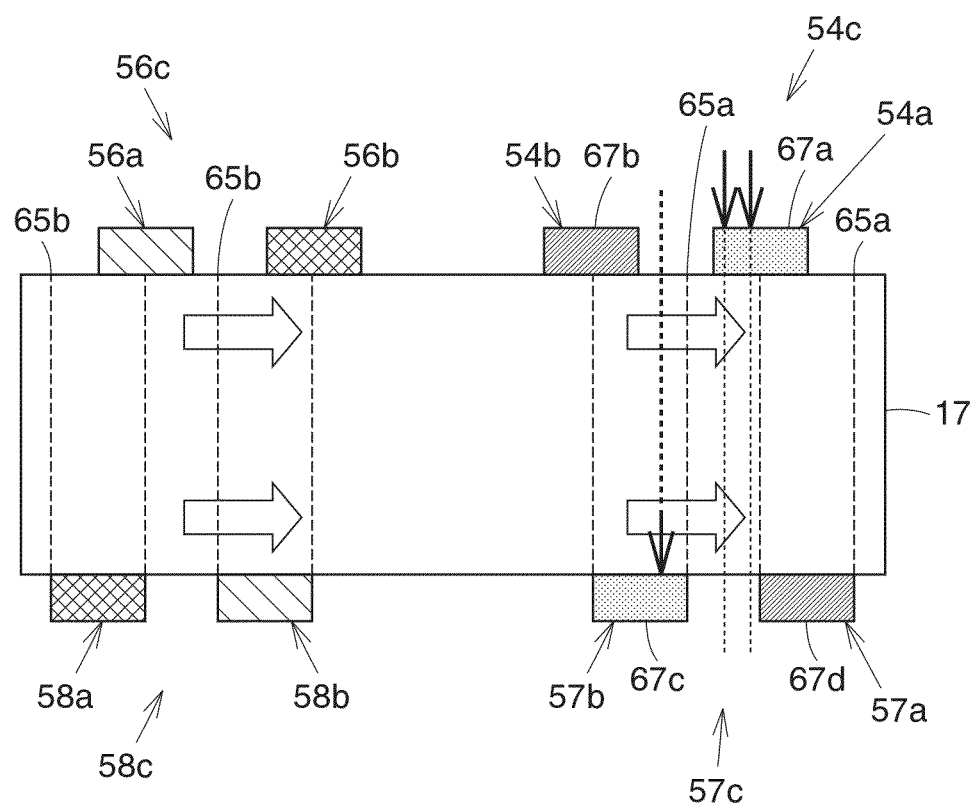
FIG. 15 is a cross-sectional view taken along line 15-15 in FIGS. 14A and 14B.

In a gyro sensor 11 according to a fourth embodiment, a vibrating element 15c is used in place of the above vibrating element 15. In this vibrating element 15c, the first tuning electrode pair 54c includes a tuning electrode (adjustment electrode) 67a connected to the signal terminal 49a of the first detection terminals, and a tuning electrode (adjustment electrode) 67b connected to the ground terminal 49b of the first detection terminals, as shown in FIGS. 14A and 14B. Meanwhile, the third tuning electrode pair 57c includes a tuning electrode (adjustment electrode) 67c arranged on the back side of the tuning electrode 67b and connected to the signal terminal 49a of the first detection terminals, and a tuning electrode (adjustment electrode) 67d arranged on the back side of the tuning electrode 67a and connected to the ground terminal 49b of the first detection terminals. As shown in FIG. 15, when a distortion occurs in the base portion 25 at the time of vibration of the second vibrating arms 27a, 27b, electrical signals with the opposite phases can be taken out from the first tuning electrode pair 54a and the third tuning electrode pair 57c. Therefore, the electrical signals with the opposite phases can offset each other. Moreover, the phase can be shifted by 180 degrees by changing the size of the first tuning electrode pair 54c or by changing the size of the third tuning electrode pair 57c. Thus, whichever side a misalignment occurs, the misalignment can be dealt with by processing either one of the electrode pairs. Also the second tuning electrode pair 56c and the fourth tuning electrode pair 58c are configured similarly. The other parts of the configuration can be similar to the above vibrating element 15.

7. Gyro Sensor According to Fifth Embodiment

Figure 16:
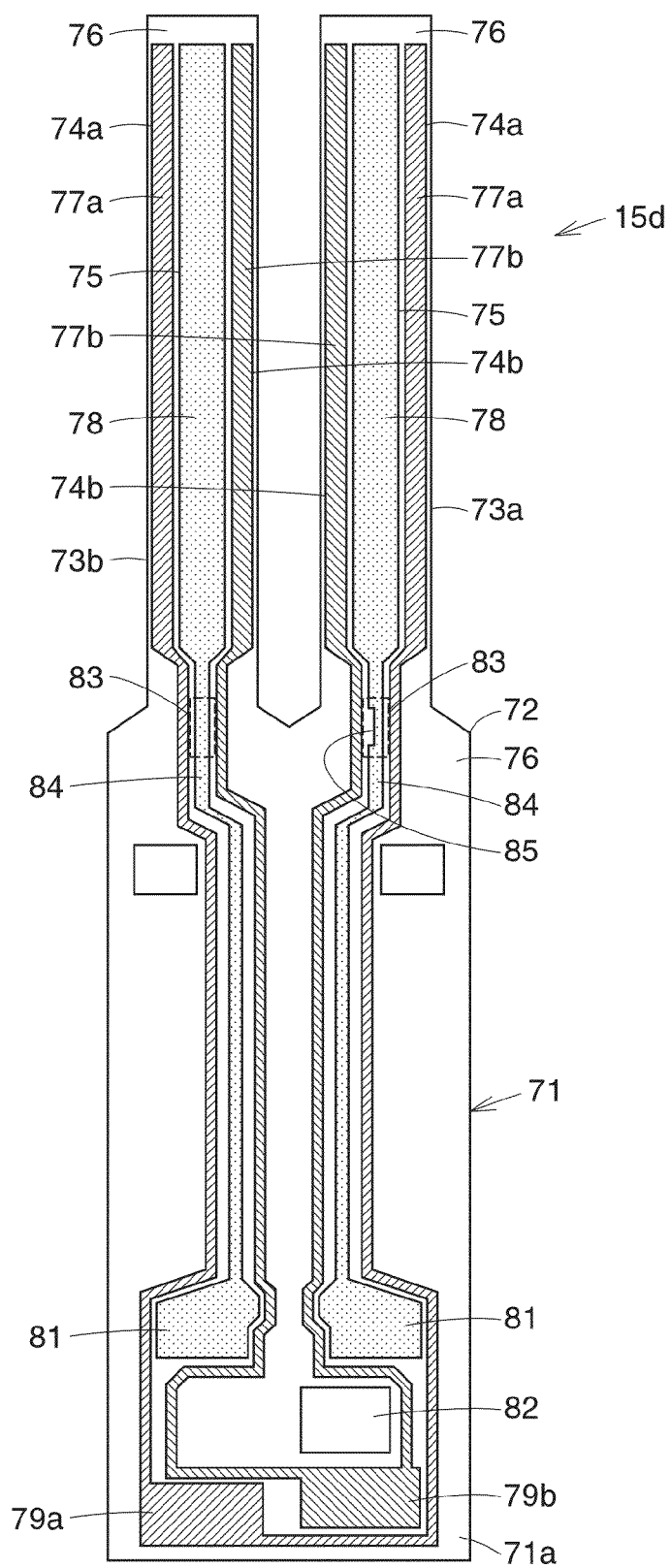
FIG. 16 is an enlarged plan view schematically showing the configuration of a vibrating element used in a gyro sensor according to a fifth embodiment.

In a gyro sensor 11 according to a fifth embodiment, a vibrating element 15d is used in place of the above vibrating element 15. As shown in FIG. 16, the vibrating element 15d has a tuning fork-shaped main body 71. The main body 71 is made of a non-piezoelectric body. Here, the main body 71 is made of, for example, silicon (Si). The main body 71 has a base portion 72, a first vibrating arm (vibrating arm for driving and vibrating arm for detection) 73a and a second vibrating arm (vibrating arm for driving and vibrating arm for detection) 73b. The first vibrating arm 73a and the second vibrating arm 73b extend parallel to each other in the same direction from a base portion 72. The first vibrating arm 73a and the second vibrating arm 73b are supported in a cantilevered form on the base portion 72. In the cantilevered support, a fixed portion 71a is marked off at one end of the main body 71.

On the surface of each of the first vibrating arm 73a and the second vibrating arm 73b, a pair of piezoelectric bodies for driving 74a, 74b and one piezoelectric body for detection 75 are stacked. The piezoelectric bodies for driving 74a, 74b and the piezoelectric body for detection 75 can be made of, for example, lead zirconate titanate (PZT). In stacking the piezoelectric bodies for driving 74a, 74b and the piezoelectric body for detection 75, an underling film 76 of an electrically conductive material is formed on the surface of the main body 71. This underlying film 76 can function as a common ground electrode. Drive electrodes 77a, 77b and a detection electrode 78 are arranged respectively on the surfaces of the piezoelectric bodies for driving 74a, 74b and the piezoelectric body for detection 75. Thus, the piezoelectric bodies for driving 74a, 74b are arranged between the drive electrodes 77a, 77b and the underlying film 76. The piezoelectric body for detection 75 is arranged between the detection electrode 78 and the underlying film 76.

A pair of drive terminals 79a, 79b and a pair of detection terminal 81 and ground terminal 82 are arranged on the fixed portion 71a. The one drive terminal 79a is connected to the one drive electrode 77a on each of the vibrating arms 73a, 73b. The other drive terminal 79b is connected to the other drive electrode 77b on each of the vibrating arms 73a, 73b. The detection terminal 81 is connected to the detection electrode 78. The ground terminal 82 is connected to the underlying film 76. Therefore, when drive signals with the opposite phases to each other are supplied to the drive electrodes 77a, 77b on the vibrating arms 73a, 73b, the first vibrating arm 73a and the second vibrating arm 73b flex between the first reference plane RP1 and the second reference plane RP2. The first vibrating arm 73a and the second vibrating arm 73b repeat moving toward and away from each other.

A piezoelectric body for adjustment 83 is stacked on the surface of the base portion 72. The piezoelectric body for adjustment 83 can be made of, for example, PZT. In stacking the piezoelectric body for adjustment 83, the underlying film 76 is formed on the surface of the main body 71. A wiring line 84 of an electrically conductive material is laid along the surface of the piezoelectric body for adjustment 83. The wiring line 84 extends from the detection electrode 78 and is connected to the detection terminal 81. Thus, the piezoelectric body for adjustment 83 is arranged between the wiring line 84 and the underlying film 76. The wiring line 84 and the underlying film 76 can function as electrodes of the piezoelectric body for adjustment 83, that is, as an adjustment electrode pair.

In detecting angular velocity, when the first vibrating arm 73a and the second vibrating arm 73b excite vibration in walk mode, stress is formed in the base portion 72. In the piezoelectric body for adjustment 83, an electric field is generated based on a piezoelectric effect, and electric charge is generated. Therefore, electric charge based on the piezoelectric effect is generated between the wiring line 84 and the underlying film 76 and a potential difference between the wiring line 84 and the underlying film 76 is generated. This potential difference can generate an electrical signal with an opposite phase to an output signal of leak vibration of the piezoelectric body for detection 75. The generated electric signal is superimposed on the output signal of the piezoelectric body for detection 75. Consequently, the leak vibration component in the output signal of the piezoelectric body for detection 75 is canceled. Thus, the S/N ratio of the output signal is improved.

Here, the wiring line 84 on the piezoelectric body for adjustment 83 is at least partly eliminated. As a "cut-out 85" is thus formed in the contour of the wiring line 84, the area of the piezoelectric body for adjustment 83 located between the wiring line 84 and the underlying film 76 is reduced. Consequently, the piezoelectric body contributing to the generation of the electrical signal with the opposite phase is reduced. Thus, the amount of electric charge of the electrical signal with the opposite phase can be adjusted. Therefore, the leak vibration component can be canceled satisfactorily.

Figure 17:
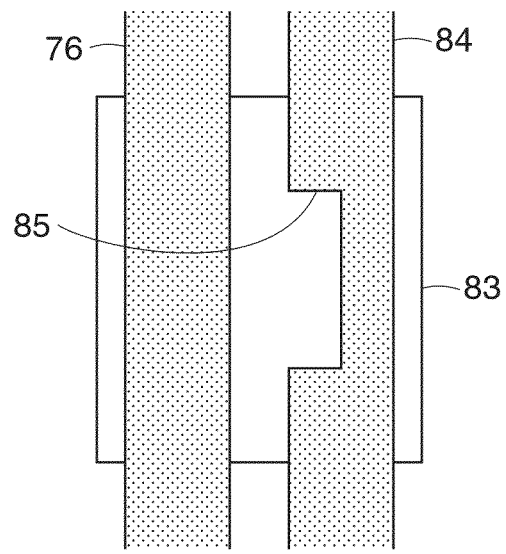
FIG. 17 is an enlarged plan view of a piezoelectric body for adjustment.

The common ground electrode 76 and wiring line 84 may extend parallel to each other on the piezoelectric body for adjustment 83, as shown in FIG. 17. When the "cut-out 85" is formed in the contour of the wiring line 84, the space between the contour of the wiring line 84 and the contour of the ground electrode 76 is partly expanded. As the space between the wiring line 84 and the ground electrode 76 is thus expanded, the current circulating between the wiring line 84 and the ground electrode 76 decreases. Consequently, the current contributing to the generation of the electrical signal with the opposite phase is reduced. Thus, the amount of electric charge of the electrical signal with the opposite phase can be adjusted. Therefore, the leak vibration component can be canceled satisfactorily.

Figure 18:
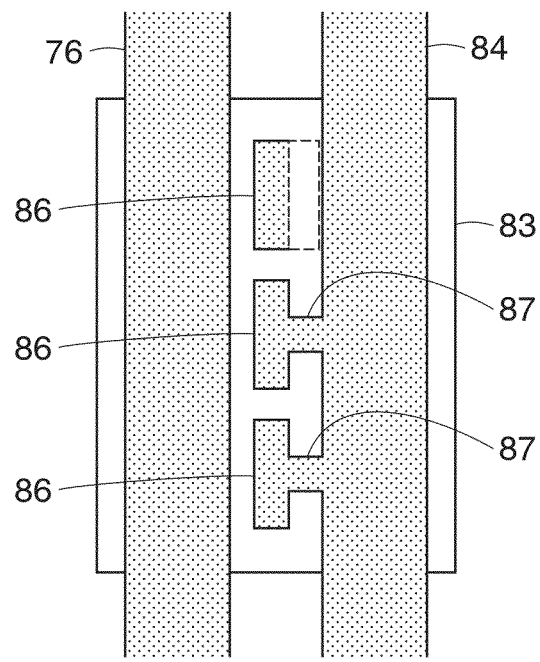
FIG. 18 is an enlarged plan view of a piezoelectric body for adjustment.

Plural electrically conductive pieces 86 may be arranged between the wiring line (wiring line main body) 84 and the ground electrode (wiring line main body) 76 extending parallel to each other on the piezoelectric body for adjustment 83, as shown in FIG. 18. The electrically conductive pieces 86 are arranged along the longitudinal direction of the wiring line 84. Each of the electrically conductive pieces 86 is connected to the wiring line 84 via an electrically conductive thin line 87. Thus, an adjustment electrode pair can be formed by the electrically conductive pieces 86 and the ground electrode 76 spaced apart from each other on the surface of the piezoelectric body for adjustment 83. For example, when the electrically conductive thin line 87 is eliminated from the electrically conductive pieces 86, the current of the piezoelectric body is taken out from the wiring line 84 and the ground electrode 76. Since the distance between the wiring line 84 and the ground electrode 76 is longer than the distance between the electrically conductive pieces 86 and the ground electrode 76, the circulating current decreases. Consequently, the current contributing to the generation of the electrical signal with the opposite phase is reduced. Since the amount of increase or decrease in the amount of electric charge depends on the size of the electrically conductive pieces 86, the amount of electric charge of the electrical signal with the opposite phase can be adjusted by simple work such as maintaining or eliminating the electrically conductive thin lines 87.

8. Electronic Apparatus and Other Applications

Figure 19:
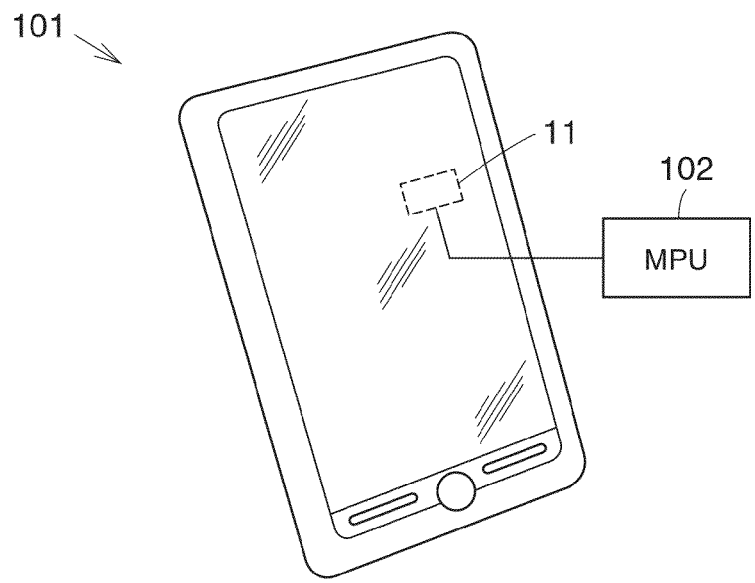
FIG. 19 is a conceptual view schematically showing the configuration of a smartphone as a specific example of an electronic apparatus.

FIG. 19 schematically shows a smartphone 101 as a specific example of an electronic apparatus. The gyro sensor 11 having the vibrating element 15, 15a to 15d is installed in the smartphone 101. The gyro sensor 11 can detect the attitude of the smartphone 101. So-called motion sensing is implemented. A detection signal from the gyro sensor 11 can be supplied, for example, to a microcomputer chip (MPU) 102. The MPU 102 can execute various kinds of processing according to the motion sensing. Also, such motion sensing can be utilized in various electronic apparatuses such as mobile phone, portable game machine, game controller, car navigation system, pointing device, head mount display, and tablet PC. The gyro sensor 11 is installed in order to realize the motion sensing.

Figure 20:
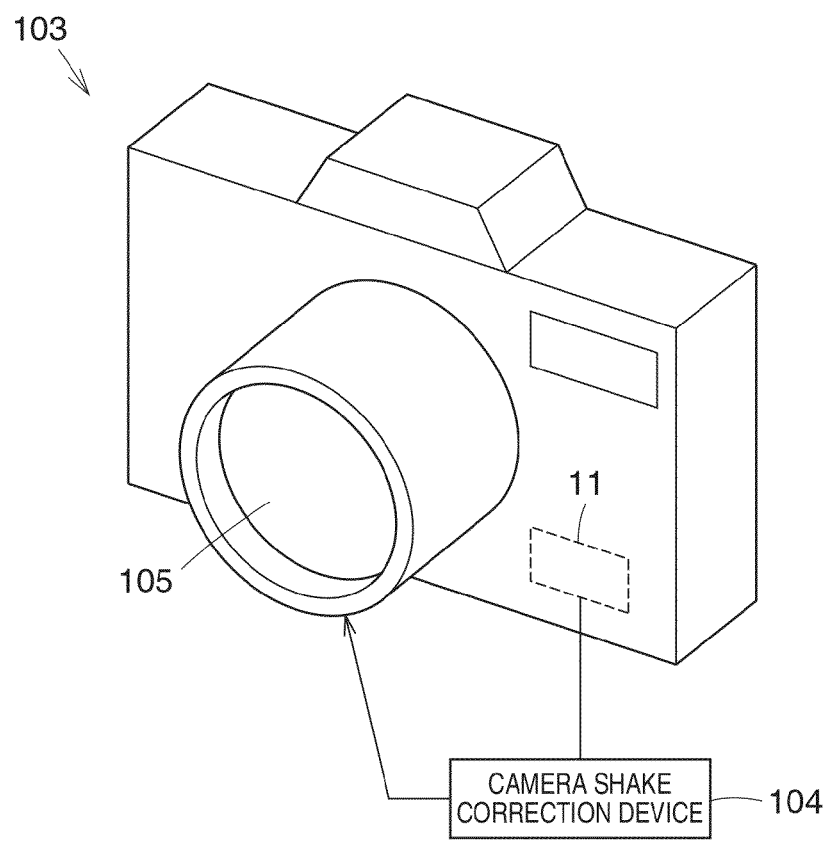
FIG. 20 is a conceptual view schematically showing the configuration of a digital still camera as another specific example of an electronic apparatus.

FIG. 20 schematically shows a digital still camera (hereinafter referred to as a "camera") 103 as another specific example of an electronic apparatus. The gyro sensor 11 having the vibrating element 15, 15a to 15d is installed in the camera 103. The gyro sensor 11 can detect the attitude of the camera 103. A detection signal from the gyro sensor 101 can be supplied to a camera shake correction device 104. The camera shake correction device 104 can move, for example, a specific lens in a lens set 105 according to the detection signal from the gyro sensor 11. Camera shake can thus be corrected. Also, the camera shake correction can be utilized in a digital video camera. The gyro sensor 11 is installed in order to realize the camera shake correction.

Figure 21:
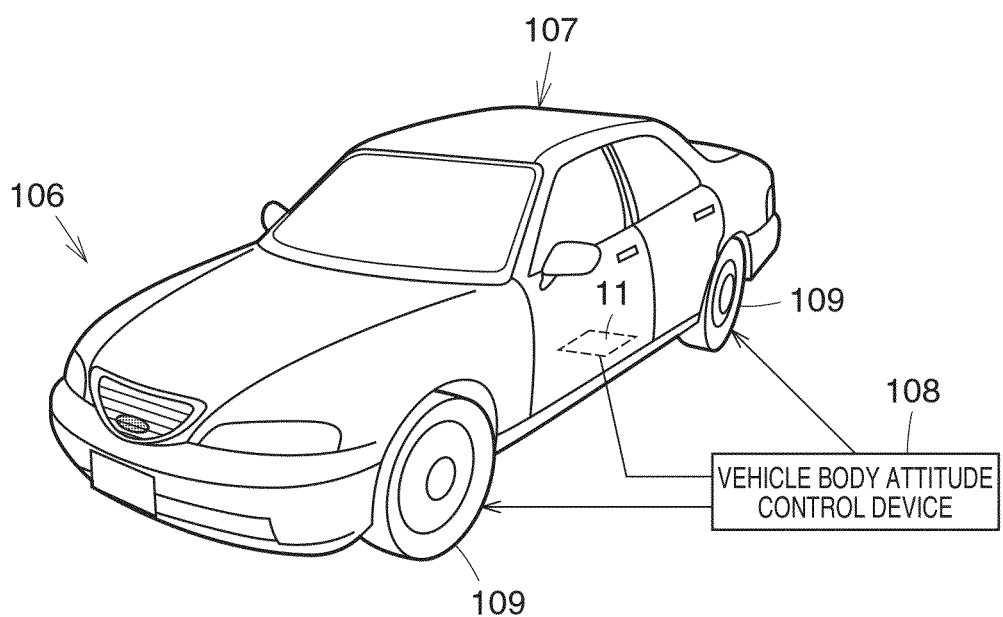
FIG. 21 is a conceptual view schematically showing the configuration of an automobile as a specific example of a moving object.

FIG. 21 schematically shows an automobile 106 as a specific example of a moving object. The gyro sensor 11 having the vibrating element 15, 15a to 15d is installed in the automobile 106. The gyro sensor 11 can detect the attitude of a vehicle body 107. A detection signal from the gyro sensor 11 can be supplied to a vehicle body attitude control device 108. The vehicle body attitude control device 108 can, for example, control hard or soft suspension setting or control the brakes on individual wheels 109 according to the attitude of the vehicle body 107. Also, such attitude control can be utilized in various moving objects such as biped robot, aircraft and helicopter. The gyro sensor 11 is installed in order to realize the attitude control.

The embodiments are described above in detail. However, a person skilled in the art can easily understand that various modifications can be made without substantially departing from the novel features and advantages of the invention. Therefore, all such modifications are included in the scope of the invention. For example, while an example of using crystal as the material of the vibrating element is described in the above embodiments and modifications, other piezoelectric materials than crystal can be used. For example, aluminum nitride (AlN), or a multilayer piezoelectric substrate formed by stacking a piezoelectric material such as aluminum nitride or tantalum pentoxide ($Ta_2O_5$) on an oxide substrate such as lithium niobate ($LiNbO_3$), lithium tantalate ($LiTaO_3$), lead zirconate titanate (PZT), lithium tetraborate ($Li_2B_4O_7$) or langasite ($La_3Ga_5SiO_{14}$) or on a glass substrate, or piezoelectric ceramics or the like can be used. Also, in the specification and drawings, a term that is described together with a different term having a broader meaning or the same meaning at least once can be replaced by that different term. Moreover, the configurations and operations of the gyro sensor 11, the vibrating elements 15, 15a, 15b, 15c, 15d, the smartphone 101, the camera 103, the automobile 106 and the like are not limited to the description of the embodiments, and various modifications can be made.

The entire disclosure of Japanese Patent Application No: 2012-74795, filed Mar. 28, 2012 is expressly incorporated by reference herein.

What is claimed is:

1. A vibrating element comprising:
   a base portion which is a non-piezoelectric body;
   a piezoelectric body for adjustment provided on the base portion;
   a vibrating arm for driving and a vibrating arm for detection which extend from the base portion;
   a wiring line which is connected to an electrode provided on the vibrating arm for detection and is arranged in the piezoelectric body for adjustment; and
   an adjustment electrode which is at least a part of the wiring line and generates an electrical signal with an opposite phase to an output signal of leak vibration of the vibrating arm for detection.

2. The vibrating element according to claim 1, wherein at least a part of the adjustment electrode is eliminated.

3. The vibrating element according to claim 1, wherein the adjustment electrode includes
   a wiring line main body connected to the electrode provided on the vibrating arm for detection, and
   plural electrically conductive pieces which are arrayed in a longitudinal direction of the wiring line main body and are each connected to the wiring line main body via an electrically conductive thin line.

* * * * *